United States Patent
Zhang et al.

(10) Patent No.: US 12,334,149 B2
(45) Date of Patent: Jun. 17, 2025

(54) DATA READING CIRCUIT AND DATA READING CIRCUIT CONTROL METHOD

(71) Applicant: HUAWEI TECHNOLOGIES CO., LTD., Guangdong (CN)

(72) Inventors: Ziyue Zhang, Shenzhen (CN); Yue Pan, Shenzhen (CN); Mingen Bu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 262 days.

(21) Appl. No.: 18/297,633

(22) Filed: Apr. 9, 2023

(65) Prior Publication Data
US 2023/0245700 A1    Aug. 3, 2023

Related U.S. Application Data

(63) Continuation of application No. PCT/CN2020/123767, filed on Oct. 26, 2020.

(51) Int. Cl.
*G11C 11/00*    (2006.01)
*G11C 7/08*    (2006.01)
*G11C 13/00*    (2006.01)

(52) U.S. Cl.
CPC .............. *G11C 13/004* (2013.01); *G11C 7/08* (2013.01); *G11C 2013/0045* (2013.01); *G11C 2013/0054* (2013.01)

(58) Field of Classification Search
CPC ............ G11C 13/004; G11C 7/08; G11C 2013/0045; G11C 2013/0054;
(Continued)

(56) References Cited

U.S. PATENT DOCUMENTS

| 10,726,897 B1 | 7/2020 | Maffitt et al. |
| 2007/0140003 A1* | 6/2007 | Ido .................... G11C 8/08 365/185.2 |

(Continued)

FOREIGN PATENT DOCUMENTS

| CN | 103208301 A | 7/2013 |
| CN | 103295626 A | 9/2013 |

(Continued)

OTHER PUBLICATIONS

Yi-Chun Shih et al, Logic Process Compatible 40nm 16Mb, Embedded Perpendicular-MRAM with Hybrid-Resistance Reference, sub—A Sensing Resolution, and 17.5nS Read Access Time, IEEE Journal of Solid-State Circuits ( vol. 54, Issue: 4, Apr. 2019), 2 pages.

*Primary Examiner* — Hien N Nguyen

(57) ABSTRACT

A data reading circuit for reading data stored in a resistive random access memory includes a sense amplifier, a first switch, a second switch, a current trimming circuit, and a reference cell. The sense amplifier has a first input terminal coupled to a first terminal of the first switch and the data cell, and a second input terminal coupled to a first terminal of the second switch and the reference cell. A second terminal of the first switch is coupled to a second terminal of the second switch through the current trimming circuit. The current trimming circuit is configured to trim a current of the first input terminal of the sense amplifier, or trim a current of the second input terminal of the sense amplifier.

14 Claims, 16 Drawing Sheets

(58) Field of Classification Search
CPC ........... G11C 7/065; G11C 7/14; G11C 7/227; G11C 11/1655; G11C 29/026; G11C 11/1693; G11C 13/0026; G11C 13/0061; G11C 2207/002; G11C 2207/2254; G11C 29/021; G11C 29/028; G11C 11/1673
See application file for complete search history.

(56) References Cited

U.S. PATENT DOCUMENTS

| | | | | |
|---|---|---|---|---|
| 2007/0147112 A1* | 6/2007 | Edahiro | ............... | G11C 7/065 365/208 |
| 2007/0189069 A1* | 8/2007 | Negut | ............... | G11C 16/30 365/185.2 |
| 2007/0280021 A1* | 12/2007 | Ueda | ............... | G11C 7/065 365/158 |
| 2008/0192537 A1* | 8/2008 | Kasuta | ............... | G11C 16/28 365/185.2 |
| 2010/0054042 A1* | 3/2010 | Miki | ............... | G11C 29/02 365/208 |
| 2010/0103726 A1* | 4/2010 | Bae | ............... | G11C 11/5678 365/210.1 |
| 2011/0050196 A1* | 3/2011 | Fuse | ............... | G11C 7/14 323/312 |
| 2012/0314478 A1* | 12/2012 | Ha | ............... | G11C 13/003 365/158 |
| 2015/0022264 A1 | 1/2015 | Kim et al. | | |
| 2019/0108886 A1 | 4/2019 | Paolino et al. | | |
| 2021/0241830 A1 | 8/2021 | Lin et al. | | |

FOREIGN PATENT DOCUMENTS

| | | |
|---|---|---|
| CN | 106128497 A | 11/2016 |
| CN | 108538334 A | 9/2018 |

\* cited by examiner

DATA READING CIRCUIT AND DATA READING CIRCUIT CONTROL METHOD

CROSS-REFERENCE TO RELATED APPLICATIONS

This application is a continuation of International Application. PCT/CN2020/123767, filed on Oct. 26, 2020, the disclosure of which is hereby incorporated by reference in its entirety.

TECHNICAL FIELD

Embodiments of this application relate to the field of circuit technologies, and in particular, to a data reading circuit and a data reading circuit control method.

BACKGROUND

A resistive random access memory is a new type of memory, and a data cell of the new type of memory is usually formed by one storage medium unit and one transistor (1T1R). As shown in FIG. 1, the storage medium unit may be a resistor R whose high and low resistive states are variable. Different resistive states of the resistor R may indicate data "0" and data "1". A gate of the transistor is controlled by a word line (WL), and the word line is responsible for selecting or not selecting the data cell. A structure of the 1T1R is connected to a bit line (BL) and a source line (SL).

As shown in FIG. 2, in a process of reading the new type of memory, a suitable voltage is applied to the data cell through a reading circuit, so that a high current $I_H$ and a low current $I_L$ respectively flow through data cells in different resistive states. Then, a sense amplifier (S/A) compares a current $I_D$ of a data branch with a current $I_{REF}$ of a reference branch, and amplifies a difference between $I_D$ and $I_{REF}$ to obtain an output identifiable high/low level signal. That is, the sense amplifier identifies, based on $I_{REF}$, whether $I_D$ is $I_H$ or $I_L$. However, in actual application, a resistance value of the data cell fluctuates to a specific extent. As shown in FIG. 3, $I_H$ and $I_L$ are in Gaussian distribution, so that a REF window is very small. Only when a value of $I_{REF}$ falls within the REF window, $I_{REF}$ can be between $I_H$ and $I_L$.

However, because a transistor in the reading circuit has a process deviation, it cannot be ensured that $I_{REF}$ falls within an ideal REF window. When $I_{REF}$ is greater than $I_H$, a data cell in a low resistive state may be read as a data cell in a high resistive state. As a result, the data cell is incorrectly read. When $I_{REF}$ is less than $I_L$, a data cell in a high resistive state may be read as a data cell in a low resistive state. As a result, the data cell is incorrectly read. Therefore, regardless of whether $I_{REF}$ is greater than $I_H$ or less than $I_L$, a circuit yield is low.

To improve precision of $I_{REF}$ in the new type of memory, FIG. 4 shows a data reading circuit including a trimming circuit ("Logic Process Compatible 40-nm 16-Mb, embedded Perpendicular-MRAM with Hybrid-Resistance Reference, Sub-µA Sensing Resolution"), and the trimming circuit may trim the value of $I_{REF}$. As shown in FIG. 4, symmetric trimming circuits are disposed on a data branch and a reference branch of each S/A, so that different quantities of branches in the trimming circuit can be turned on based on an actual deviation of $I_{REF}$ in each S/A, to change $I_{REF}$ on the reference branch or $I_D$ on the data branch to different degrees.

However, because $I_{REF}$ is only greater than $I_H$ or less than $I_L$, only a trimming circuit on one side in FIG. 4 is used, and a trimming circuit on the other side is always in an idle state. In addition, the trimming circuit in the idle state occupies a large board area. Therefore, the trimming circuit causes a waste. With reference to FIG. 4, as shown in FIG. 5, a trimming circuit is formed by connecting a plurality of columns of transistors in parallel, and the plurality of columns of transistors are connected in parallel to a node C. As a result, parasitic capacitors of each column of transistors are directly added to the node C, and load of the node C is increased. Consequently, charging and discharging speeds on a BL are slowed down, and a read speed of the S/A is affected.

SUMMARY

Embodiments of this application provide a data reading circuit and a data reading circuit control method, to reduce a board area occupied by a trimming circuit and increase a read speed.

To achieve the foregoing objectives, the following technical solutions are used in embodiments of this application.

According to a first aspect of embodiments of this application, a data reading circuit is provided. The data reading circuit includes a sense amplifier, a first switch, a second switch, a current trimming circuit, a data cell, and a reference cell. A first input terminal of the sense amplifier is coupled to a first terminal of the first switch and the data cell, a second input terminal of the sense amplifier is coupled to a first terminal of the second switch and the reference cell, and a second terminal of the first switch is coupled to a second terminal of the second switch through the current trimming circuit. The current trimming circuit is configured to trim a current of the first input terminal of the sense amplifier, or trim a current of the second input terminal of the sense amplifier. Based on this solution, the data reading circuit may choose to trim a current of a data branch or a current of a reference branch through the first switch and the second switch. Therefore, in the data reading circuit, only one current trimming circuit is disposed to trim the current of the data branch or the current of the reference branch. In comparison with the conventional technology in which one trimming circuit is disposed on each of a data branch and a reference branch, one trimming circuit trims a current of the data branch, and one trimming circuit trims a current of the reference branch, a board area occupied by the trimming circuit is reduced. In addition, in the solution of this application, the first switch and the second switch are disposed, so that parasitic capacitors of a plurality of columns of transistors in the current trimming circuit are not applied to a first node C1 (a coupling point between the first input terminal of the sense amplifier and the first terminal of the first switch and the data cell) and a second node C2 (a coupling point between the second input terminal of the sense amplifier and the first terminal of the second switch and the reference cell). This reduces parasitic capacitors at the first node C1 and the second node C2, and further increases a read speed of the S/A.

With reference to the first aspect, in a possible implementation, the current trimming circuit includes M first trimming branches, M is an integer greater than or equal to 1, and each first trimming branch includes a third switch and a first transistor connected in series to the third switch. A first terminal of the first transistor is coupled to the second terminal of the first switch and the second terminal of the second switch, a second terminal of the first transistor is coupled to a first terminal of the third switch, a second terminal of the third switch is coupled to a power supply, and third terminals of first transistors in the M first trimming branches are coupled to each other. Based on this solution, when the first switch or the second switch is turned on, the first trimming branch is turned on. This can reduce a current of a trimmed branch. It may be understood that when the first switch is turned on, the trimmed branch is a data branch, or when the second switch is turned on, the trimmed branch is a reference branch. When a current of a reference branch is greater than $I_H$, the trimmed branch is a reference branch. When a current of a reference branch is less than $I_L$, the trimmed branch is a data branch. A plurality of first trimming branches in the current trimming branches may provide trimming of different levels.

With reference to the first aspect and the foregoing possible implementation, in another possible implementation, each first trimming branch further includes a second transistor, a first terminal of the second transistor is coupled to the second terminal of the first transistor, a second terminal of the second transistor is coupled to the first terminal of the third switch, and third terminals of second transistors in the M first trimming branches are coupled to each other. Based on this solution, the first trimming branch may include two transistors (the first transistor and the second transistor) that are connected in series, to increase an equivalent resistance in each first trimming branch. Optionally, each first trimming branch may further include three or more transistors. The plurality of transistors are connected in series to the third switch, and third terminals of transistors at corresponding positions in the M first trimming branches may be coupled to each other, so that different first trimming branches have a same equivalent resistance.

With reference to the first aspect, in another possible implementation, the current trimming circuit includes N second trimming branches, N is an integer greater than or equal to 1, and each second trimming branch includes a fourth switch and a third transistor connected in series to the fourth switch. A first terminal of the third transistor is coupled to the second terminal of the first switch and the second terminal of the second switch, a second terminal of the third transistor is coupled to a first terminal of the fourth switch, a second terminal of the fourth switch is grounded, and third terminals of third transistors in the N second trimming branches are coupled to each other. Based on this solution, when the first switch or the second switch is turned on, the second trimming branch is turned on. This can increase a current of a trimmed branch. It may be understood that when the first switch is turned on, the trimmed branch is a data branch, or when the second switch is turned on, the trimmed branch is a reference branch. When a current of a reference branch is greater than $I_H$, the trimmed branch is a data branch. When a current of a reference branch is less than $I_L$, the trimmed branch is a reference branch. A plurality of second trimming branches in the current trimming branches may provide trimming of different levels.

With reference to the first aspect and the foregoing possible implementation, in another possible implementation, each second trimming branch further includes a fourth transistor, a first terminal of the fourth transistor is coupled to the second terminal of the third transistor, a second terminal of the fourth transistor is coupled to the first terminal of the fourth switch, and third terminals of fourth transistors in the N second trimming branches are coupled to each other. Based on this solution, the second trimming branch may include two transistors (the third transistor and the fourth transistor) that are connected in series, to increase an equivalent resistance in each second trimming branch. Optionally, each second trimming branch may further include three or more transistors. The plurality of transistors are connected in series to the fourth switch, and third terminals of transistors at corresponding positions in the N second trimming branches may be coupled to each other, so that different second trimming branches have a same equivalent resistance.

With reference to the first aspect and the foregoing possible implementations, in another possible implementation, the data reading circuit further includes registers and a one-time programmable memory coupled to the registers, and the registers are coupled to the first switch, the second switch, and the current trimming circuit. The registers are configured to: obtain control information from the one-time programmable memory; and control the first switch and the current trimming circuit based on the control information, or control the second switch and the current trimming circuit based on the control information. The control information includes control manners of the first switch and the current trimming circuit, or includes control manners of the second switch and the current trimming circuit. Based on this solution, when the current of the reference branch is greater than $I_H$ or less than $I_L$, the data reading circuit may control the first switch or the second switch through the registers, and trim a current value of the reference branch or the data branch through the current trimming circuit, so that the current of the reference branch may be within an ideal REF window, to improve accuracy of reading the data cell. Optionally, the control information may include turning on the first switch and a switch in the current trimming circuit, or include turning on the second switch and a switch in the current trimming circuit.

With reference to the first aspect and the foregoing possible implementations, in another possible implementation, the data reading circuit further includes a fifth transistor and a sixth transistor. A first terminal of the fifth transistor is coupled to the first terminal of the first switch, a second terminal of the fifth transistor is coupled to the data cell, and a third terminal of the fifth transistor is coupled to a preset voltage. A first terminal of the sixth transistor is coupled to the first terminal of the second switch, a second terminal of the sixth transistor is coupled to the reference cell, and a third terminal of the sixth transistor is coupled to the preset voltage. Based on this solution, the fifth transistor and the sixth transistor are coupled to the preset voltage, so that current values of the data cell and the reference cell can be controlled, and a fault of the reference cell or the data cell caused due to an excessively high current can be avoided.

According to a second aspect of embodiments of this application, a data reading circuit control method is provided. A data reading circuit includes a sense amplifier, a first switch, a second switch, a current trimming circuit, a data cell, and a reference cell. A first input terminal of the sense amplifier is coupled to a first terminal of the first switch and the data cell, a second input terminal of the sense amplifier is coupled to a first terminal of the second switch and the reference cell, and a second terminal of the first switch is coupled to a second terminal of the second switch through the current trimming circuit. The current trimming circuit is configured to trim a current of the first input terminal of the sense amplifier, or trim a current of the second input terminal of the sense amplifier. The method includes: obtaining control information, where the control information includes control manners of the first switch and the current trimming circuit, or includes control manners of the second switch and the current trimming circuit; and controlling the first switch and the current trimming circuit based on the control information, or controlling the second switch and the current trimming circuit based on the control information. Based on this solution, the control information is obtained, so that a current of a data branch or a current of a reference branch can be trimmed. In this way, the current of the reference branch falls within an ideal REF window, and data of the data cell can be accurately read. In this solution, when the current of the reference branch is greater than $I_H$ or less than $I_L$, the first switch or the second switch is controlled, and a current value of the reference branch or the data branch is trimmed through the current trimming circuit, so that the current of the reference branch falls within the ideal REF window. That is, in this solution, only one current trimming circuit is disposed to trim the current of the data branch or the current of the reference branch. This reduces a board area occupied by the trimming circuit and increases a read speed of the S/A. In addition, the first switch and the second switch are disposed, so that parasitic capacitors at a first node C1 and a second node C2 are reduced, and the read speed of the S/A is increased.

With reference to the second aspect, in a possible implementation, the data reading circuit further includes registers and a one-time programmable memory coupled to the registers. The registers are coupled to the first switch, the second switch, and the current trimming circuit. The obtaining control information includes: The registers obtain the control information from the one-time programmable memory. Based on this solution, the registers obtain the control information from the one-time programmable memory, so that the registers can trim the current of the data branch or the current of the reference branch. In this way, the current of the reference branch falls within the ideal REF window, and the data of the data cell can be accurately read.

With reference to the second aspect and the foregoing possible implementation, in another possible implementation, before the registers obtains the control information from the one-time programmable memory, the method may further include: The registers receive first information, where the first information indicates that a read period starts. Based on this solution, when a read operation is performed on the data cell, the registers may obtain the control information from the one-time programmable memory, to trim the current of the data branch or the current of the reference branch, so that the current of the reference branch falls within the ideal REF window, to ensure that the data of the data cell is accurately read.

With reference to the second aspect and the foregoing possible implementations, in another possible implementation, the current trimming circuit includes M first trimming branches, M is an integer greater than or equal to 1, and each first trimming branch includes a third switch and a first transistor connected in series to the third switch. A first terminal of the first transistor is coupled to the second terminal of the first switch and the second terminal of the second switch, a second terminal of the first transistor is coupled to a first terminal of the third switch, a second terminal of the third switch is coupled to a power supply, and third terminals of first transistors in the M first trimming branches are coupled to each other. Based on this solution, when the first switch or the second switch is turned on, the first trimming branch is turned on. This can reduce a current of a trimmed branch. It may be understood that when the first switch is turned on, the trimmed branch is a data branch, or when the second switch is turned on, the trimmed branch is a reference branch. When a current of a reference branch is greater than $I_H$, the trimmed branch is a reference branch. When a current of a reference branch is less than $I_L$, the trimmed branch is a data branch. A plurality of first trimming branches in the current trimming branches may provide trimming of different levels.

With reference to the second aspect and the foregoing possible implementations, in another possible implementation, each first trimming branch further includes a second transistor, a first terminal of the second transistor is coupled to the second terminal of the first transistor, a second terminal of the second transistor is coupled to the first terminal of the third switch, and third terminals of second transistors in the M first trimming branches are coupled to each other. Based on this solution, the first trimming branch may include two transistors (the first transistor and the second transistor) that are connected in series, to increase an equivalent resistance in each first trimming branch. Optionally, each first trimming branch may further include three or more transistors. The plurality of transistors are connected in series to the third switch, and third terminals of transistors at corresponding positions in the M first trimming branches may be coupled to each other, so that different first trimming branches have a same equivalent resistance.

With reference to the second aspect and the foregoing possible implementations, in another possible implementation, when the current of the reference branch is greater than $I_H$, the control information includes turning on the second switch and third switches in J1 first trimming branches, where J1 is an integer greater than or equal to 1 and less than or equal to M. Based on this solution, when the current of the reference branch is greater than $I_H$, the second switch is turned on, and the plurality of first trimming branches are turned on, so that the plurality of first trimming branches and the reference branch are connected in parallel for shunting, thereby reducing the current of the reference branch. In addition, the current of the reference branch may be within the ideal REF window, to ensure that the data of the data cell is correctly read.

With reference to the second aspect and the foregoing possible implementations, in another possible implementation, the method further includes: The registers receive second information, where the second information indicates that the read period ends; and the registers turn off the second switch and the third switches in the J1 first trimming branches based on the second information. Based on this solution, when reading ends, the second switch and the plurality of first trimming branches may be turned off, so that when the data cell is read next time, the second switch and the current trimming circuit may be controlled again based on the control information, to accurately read the data cell.

With reference to the second aspect and the foregoing possible implementations, in another possible implementation, when the current of the reference branch is less than $I_L$, the control information includes turning on the first switch and third switches in P1 first trimming branches, where P1 is an integer greater than or equal to 1 and less than or equal to M. Based on this solution, when the current of the reference branch is less than $I_L$, the first switch is turned on, and the plurality of first trimming branches are turned on, so that the plurality of first trimming branches are connected in parallel to the data branch for shunting, thereby reducing the current of the data branch. This is equivalent to increasing the current of the reference branch, so that the current of the reference branch may be between a trimmed current $I_{H'}$ and a trimmed current $I_{L'}$ of the data branch, thereby ensuring that the data of the data cell is correctly read.

With reference to the second aspect and the foregoing possible implementations, in another possible implementation, the method further includes: The registers receive second information, where the second information indicates that the read period ends; and the registers turn off the first switch and the third switches in the P1 first trimming branches based on the second information. Based on this solution, when reading ends, the first switch and the plurality of first trimming branches may be turned off, so that when the data cell is read next time, the first switch and the current trimming circuit may be controlled again based on the control information, to accurately read the data cell.

With reference to the second aspect and the foregoing possible implementations, in another possible implementation, the current trimming circuit includes N second trimming branches, N is an integer greater than or equal to 1, and each second trimming branch includes a fourth switch and a third transistor connected in series to the fourth switch. A first terminal of the third transistor is coupled to the second terminal of the first switch and the second terminal of the second switch, a second terminal of the third transistor is coupled to a first terminal of the fourth switch, a second terminal of the fourth switch is grounded, and third terminals of third transistors in the N second trimming branches are coupled to each other. Based on this solution, when the first switch or the second switch is turned on, the second trimming branch is turned on. This can increase a current of a trimmed branch. It may be understood that when the first switch is turned on, the trimmed branch is a data branch, or when the second switch is turned on, the trimmed branch is a reference branch. When a current of a reference branch is greater than $I_H$, the trimmed branch is a data branch. When a current of a reference branch is less than $I_L$, the trimmed branch is a reference branch. A plurality of second trimming branches in the current trimming branches may provide trimming of different levels.

With reference to the second aspect and the foregoing possible implementations, in another possible implementation, each second trimming branch further includes a fourth transistor, a first terminal of the fourth transistor is coupled to the second terminal of the third transistor, a second terminal of the fourth transistor is coupled to the first terminal of the fourth switch, and third terminals of fourth transistors in the N second trimming branches are coupled to each other. Based on this solution, the second trimming branch may include two transistors (the third transistor and the fourth transistor) that are connected in series, to increase an equivalent resistance in each second trimming branch. Optionally, each second trimming branch may further include three or more transistors. The plurality of transistors are connected in series to the fourth switch, and third terminals of transistors at corresponding positions in the N second trimming branches may be coupled to each other, so that different second trimming branches have a same equivalent resistance.

With reference to the second aspect and the foregoing possible implementations, in another possible implementation, when the current of the reference branch is greater than $I_H$, the control information includes turning on the first switch and fourth switches in P2 second trimming branches, where P2 is an integer greater than or equal to 1 and less than or equal to N. Based on this solution, when the current of the reference branch is greater than $I_H$, the first switch is turned on, and the plurality of second trimming branches are turned on, so that the current of the data branch is a sum of a current on the data cell and currents on the plurality of second trimming branches. This increases the current of the data branch, which is equivalent to reducing the current of the reference branch, so that the current $I_{REF}$ of the reference branch is no longer greater than $I_H$.

With reference to the second aspect and the foregoing possible implementations, in another possible implementation, the method further includes: The registers receive second information, where the second information indicates that the read period ends; and the registers turn off the first switch and the fourth switches in the P2 second trimming branches based on the second information. Based on this solution, when reading ends, the first switch and the plurality of second trimming branches may be turned off, so that when the data cell is read next time, the first switch and the current trimming circuit may be controlled again based on the control information, to accurately read the data cell.

With reference to the second aspect and the foregoing possible implementations, in another possible implementation, when the current of the reference branch is less than $I_L$, the control information includes turning on the second switch and fourth switches in J2 second trimming branches, where J2 is an integer greater than or equal to 1 and less than or equal to N. Based on this solution, when the current of the reference branch is less than $I_L$, the second switch is turned on, and the plurality of second trimming branches are turned on, so that the current of the reference branch is a sum of a current on the reference cell and currents on the plurality of second trimming branches. Therefore, the current $I_{REF}$ of the reference branch is increased, and the current $I_{REF}$ of the reference branch is no longer less than $I_L$.

With reference to the second aspect and the foregoing possible implementations, in another possible implementation, the method further includes: The registers receive second information, where the second information indicates that the read period ends; and the registers turn off the second switch and the fourth switches in the J2 second trimming branches based on the second information. Based on this solution, when reading ends, the second switch and the plurality of second trimming branches may be turned off, so that when the data cell is read next time, the second switch and the current trimming circuit may be controlled again based on the control information, to accurately read the data cell.

With reference to the second aspect and the foregoing possible implementations, in another possible implementation, the data reading circuit further includes a fifth transistor and a sixth transistor. A first terminal of the fifth transistor is coupled to the first terminal of the first switch, a second terminal of the fifth transistor is coupled to the data cell, and a third terminal of the fifth transistor is coupled to a preset voltage. A first terminal of the sixth transistor is coupled to the first terminal of the second switch, a second terminal of the sixth transistor is coupled to the reference cell, and a third terminal of the sixth transistor is coupled to the preset voltage. Based on this solution, the fifth transistor and the sixth transistor are coupled to the preset voltage, so that current values of the data cell and the reference cell can be controlled, and a fault of the reference cell or the data cell caused due to an excessively high current can be avoided.

According to a third aspect of embodiments of this application, a storage device is provided. The storage device includes a controller and the data reading circuit according to the first aspect.

According to a fourth aspect of embodiments of this application, a terminal device is provided. The terminal device includes a processor and a memory, and the memory includes the data reading circuit according to the first aspect.

DESCRIPTION OF EMBODIMENTS

The following describes technical solutions in embodiments of this application with reference to accompanying drawings in embodiments of this application. In this application, "at least one" means one or more, and "a plurality of" means two or more. In addition, "and/or" describes an association relationship between associated objects, and represents that three relationships may exist. For example, A and/or B may represent the following cases: Only A exists, both A and B exist, and only B exists, where A and B may be singular or plural. The character "/" generally indicates an "or" relationship between the associated objects. "At least one of the following items (pieces)" or a similar expression thereof refers to any combination of these items, including any combination of singular items (pieces) or plural items (pieces). For example, at least one (piece) of a, b, or c may represent: a, b, c, a and b, a and c, b and c, or a, b, and c, where a, b, and c may be singular or plural. In addition, to clearly describe the technical solutions in embodiments of this application, terms such as "first" and "second" are used in embodiments of this application to distinguish between same items or similar items that provide basically same functions or purposes. A person skilled in the art may understand that the terms such as "first" and "second" do not limit a quantity and an execution sequence. For example, "first" in a first switch and "second" in a second switch in embodiments of this application are merely used to distinguish between different switches. Descriptions such as "first" and "second" in embodiments of this application are merely used for indicating and distinguishing between described objects, do not show a sequence, do not indicate a specific limitation on a quantity of devices in embodiments of this application, and cannot constitute any limitation on embodiments of this application.

It should be noted that, in this application, words such as "example" or "for example" are used to represent giving an example, an illustration, or a description. Any embodiment or design described as an "example" or "for example" in this application should not be explained as having more advantages than another embodiment or design. Exactly, use of the word such as "example" or "for example" is intended to present a relative concept in a specific manner.

To resolve problems in the conventional technology that a waste is caused because a trimming circuit of a memory occupies a large board area and a read speed is low, an embodiment of this application provides a data reading circuit. The data reading circuit can reduce a board area occupied by a trimming circuit, and increase a read speed of a memory. It should be noted that a current trimming circuit in the following embodiments of this application is a trimming circuit.

Figure 6:
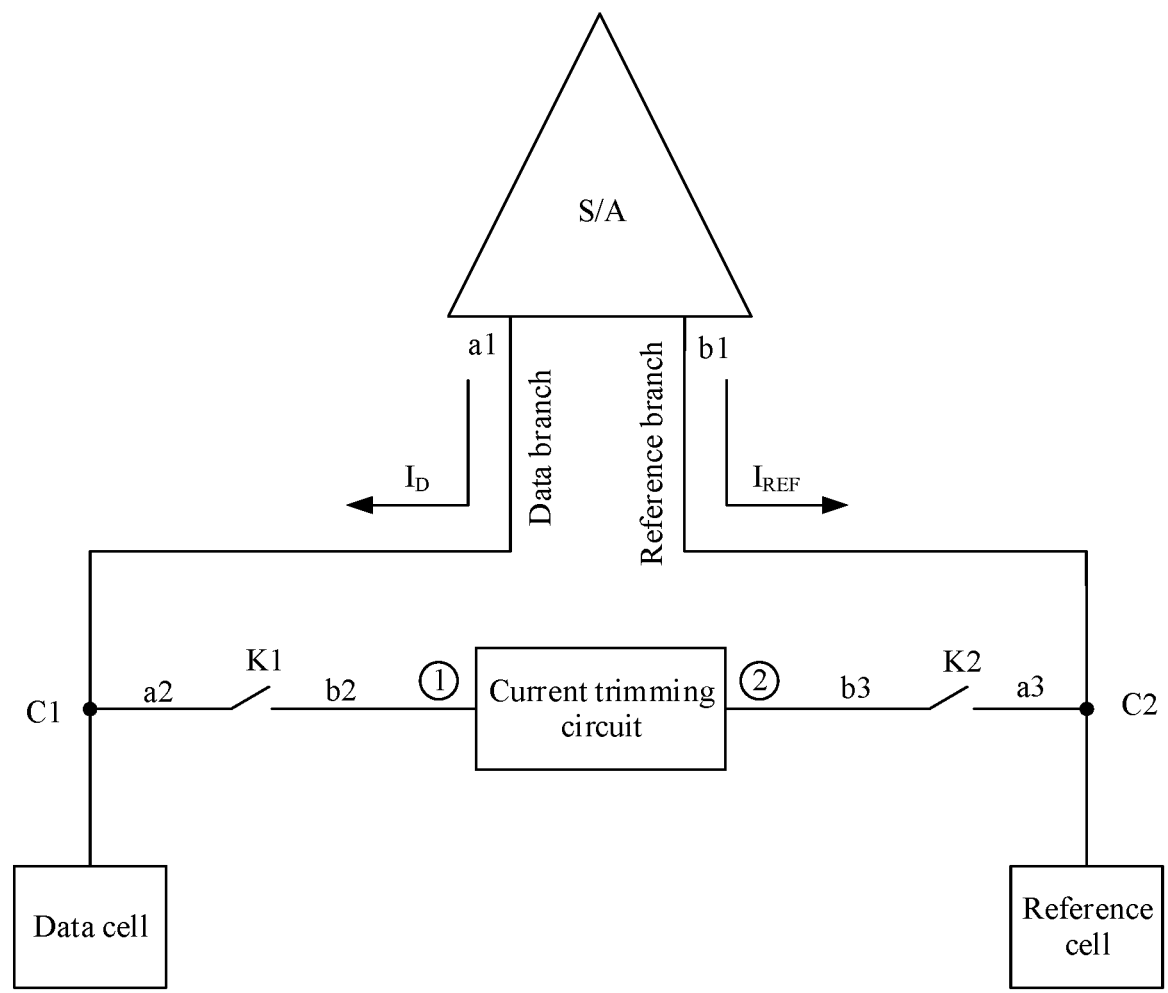
FIG. 6 is a schematic diagram of a structure of another data reading circuit according to an embodiment of this application.

FIG. 6 is a data reading circuit according to an embodiment of this application. As shown in FIG. 6, the data reading circuit includes a sense amplifier S/A, a first switch K1, a second switch K2, a current trimming circuit, a data cell, and a reference cell. A first input terminal a1 of the sense amplifier S/A is coupled to a first terminal a2 of the first switch K1 and the data cell, a second input terminal b1 of the sense amplifier S/A is coupled to a first terminal a3 of the second switch K2 and the reference cell, and a second terminal b2 of the first switch K1 is coupled to a second terminal b3 of the second switch K2 through the current trimming circuit.

For example, as shown in FIG. 6, the second terminal b2 of the first switch K1 is coupled to a first terminal ① of the current trimming circuit, and the second terminal b3 of the second switch K2 is coupled to a second terminal ② of the current trimming circuit.

The data cell is configured to store data. In a process of reading the data cell, the S/A determines, based on a current $I_{REF}$ of a reference branch, whether a current $I_D$ of a data branch is a high current $I_H$ or a low current $I_L$, and amplifies a difference between $I_D$ and $I_{REF}$ to obtain an output identifiable high/low level signal. In other words, the reference cell is configured to determine a reading result of the data cell.

The current trimming circuit is configured to trim a current of the first input terminal a1 of the sense amplifier S/A, or trim a current of the second input terminal b1 of the sense amplifier S/A. With reference to FIG. 6, the current of the first input terminal a1 of the sense amplifier S/A is the current $I_D$ of the data branch, and the current of the second input terminal b1 of the sense amplifier S/A is the current $I_{REF}$ of the reference branch.

For example, as shown in FIG. 6, the first input terminal a1 of the sense amplifier S/A, the first terminal a2 of the first switch K1, and the data cell are coupled to a first node C1, and the current $I_D$ of the data branch is a current on a branch from the first input terminal a1 of the sense amplifier S/A to the first node C1. The second input terminal b1 of the sense amplifier S/A, the first terminal a3 of the second switch K2, and the reference cell are coupled to a second node C2, and the current $I_{REF}$ of the reference branch is a current on a branch from the second input terminal b1 of the sense amplifier S/A to the second node C2. In other words, the current trimming circuit may trim $I_D$ by inputting a current into or extracting a current from the first node C1, or may trim $I_{REF}$ by inputting a current into or extracting a current from the second node C2.

When the first switch K1 is turned on, the current $I_D$ of the data branch may be trimmed through the current trimming circuit. When the second switch K2 is turned on, the current $I_{REF}$ of the reference branch may be trimmed through the current trimming circuit. That is, the current of the data branch or the reference branch may be selectively adjusted through the first switch K1 and the second switch K2. Optionally, when the current $I_{REF}$ of the reference branch is greater than $I_H$ or less than $I_L$, the current of the data branch may be trimmed, so that the current of the reference branch falls within an ideal REF window; or the current of the reference branch may be trimmed, so that the current of the reference branch falls within an ideal REF window. Specifically, whether the data branch is used as a trimmed branch or the reference branch is used as a trimmed branch is related to a circuit structure of the current trimming circuit.

The data reading circuit provided in this application may selectively adjust the current of the data branch or the current of the reference branch through the first switch and the second switch. In comparison with the conventional technology in which one trimming circuit is disposed on each of a data branch and a reference branch, one trimming circuit trims a current of the data branch, and one trimming circuit trims a current of the reference branch, only one current trimming circuit is disposed to trim the current of the data branch or the current of the reference branch in this application. Therefore, a board area occupied by the trimming circuit is reduced.

Figure 1:
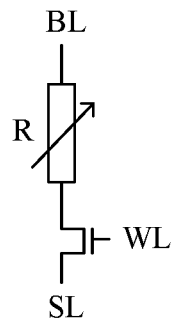
FIG. 1 is a schematic diagram of a structure of a data cell according to an embodiment of this application.
Figure 2:
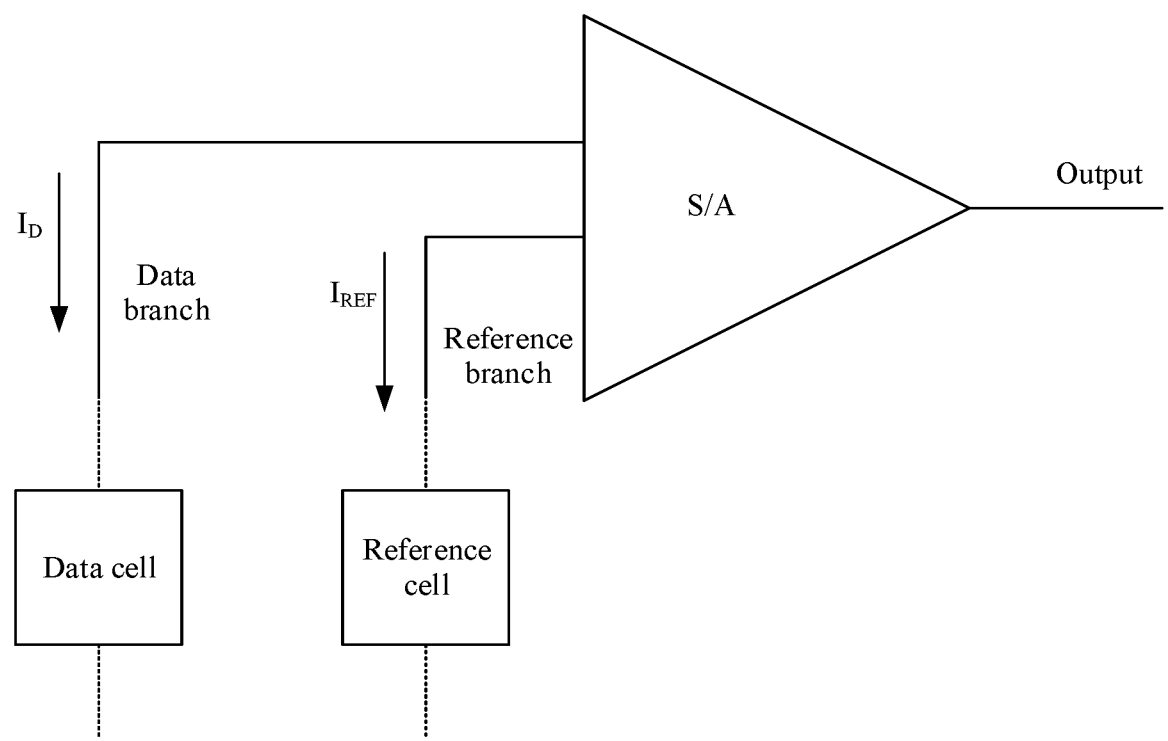
FIG. 2 is a schematic diagram of a structure of a data reading circuit according to an embodiment of this application.
Figure 3:
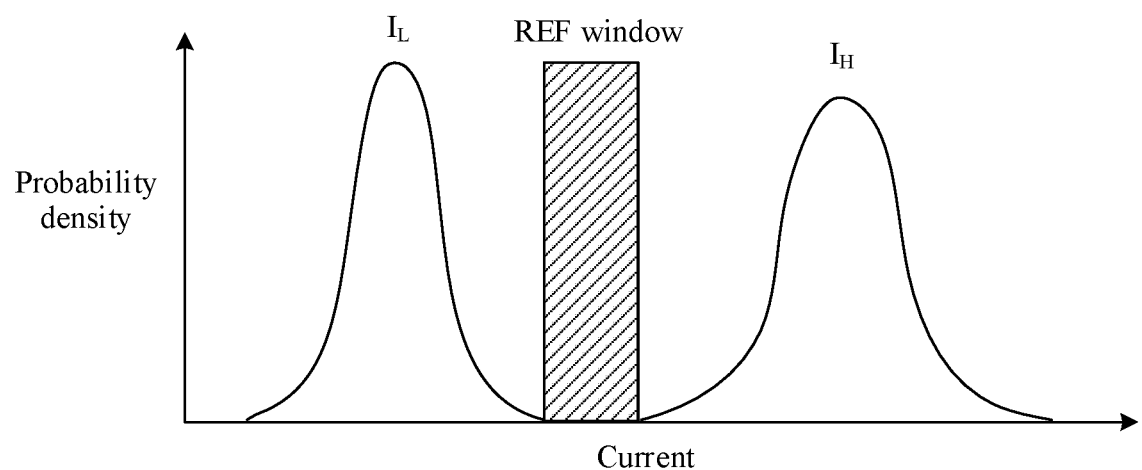
FIG. 3 is a schematic diagram of a relationship between a REF window and a current of a data branch according to an embodiment of this application.
Figure 4:
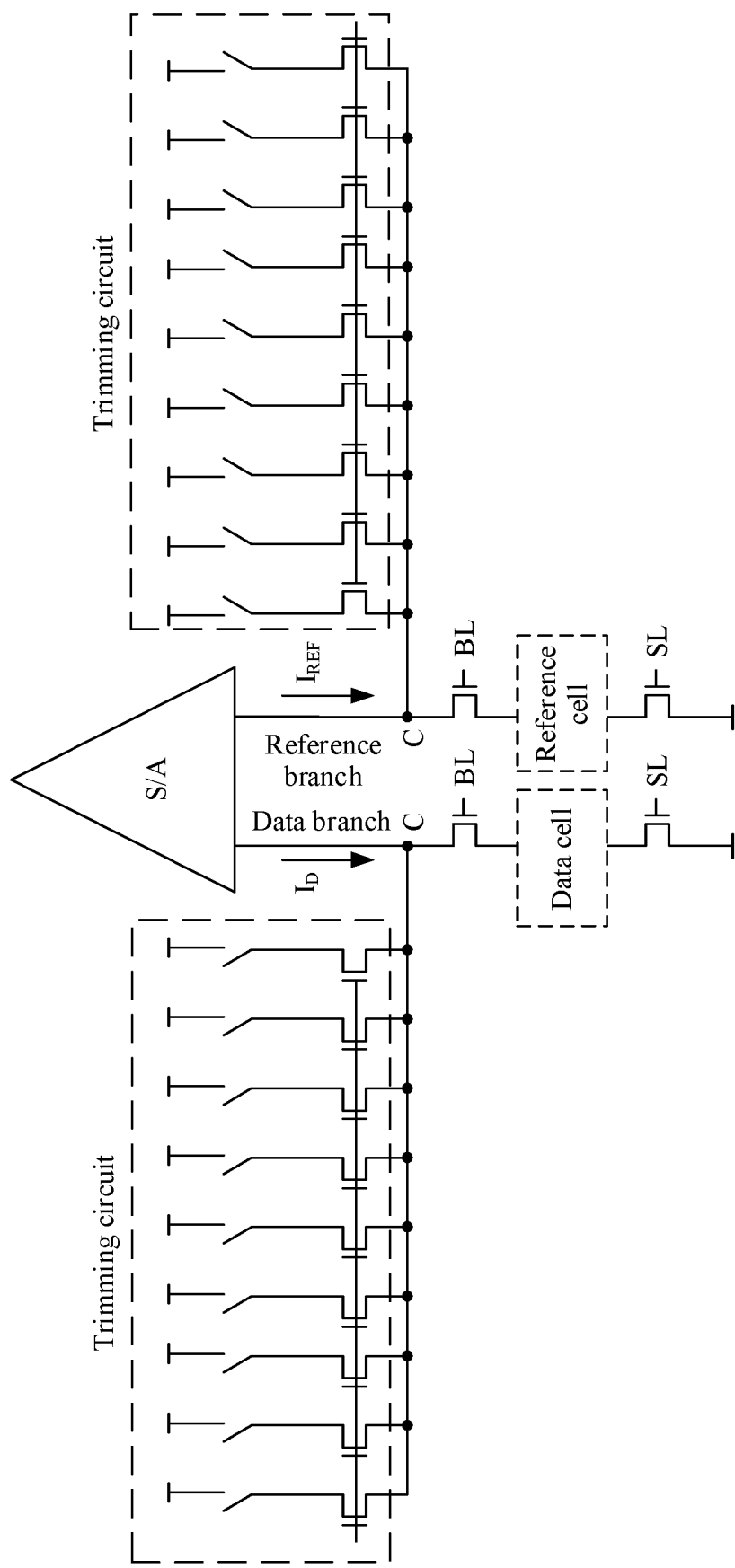
FIG. 4 is a schematic diagram of a structure of another data reading circuit according to an embodiment of this application.
Figure 5:
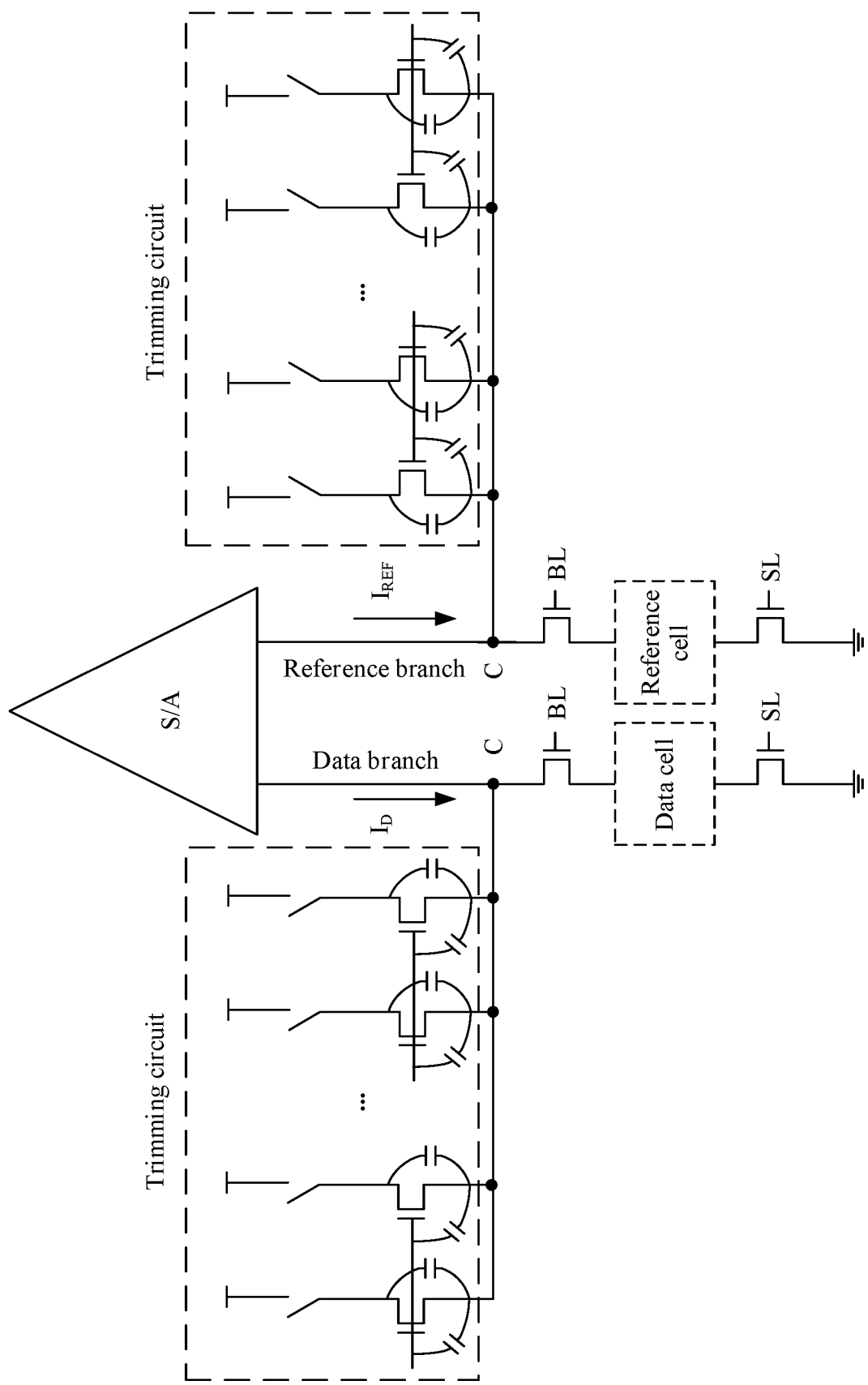
FIG. 5 is a schematic diagram of a structure of parasitic capacitors generated by a trimming circuit in a data reading circuit according to an embodiment of this application.

It may be understood that, in comparison with the circuit shown in FIG. 5, the data reading circuit provided in this application separates the current trimming circuit from the first node C1 through the first switch K1, and separates the current trimming circuit from the second node C2 through the second switch K2, so that parasitic capacitors of a plurality of columns of transistors in the current trimming circuit are not added to the first node C1 and the second node C2. This reduces parasitic capacitors at the first node C1 and the second node C2, and increases a read speed of the S/A.

Figure 7:
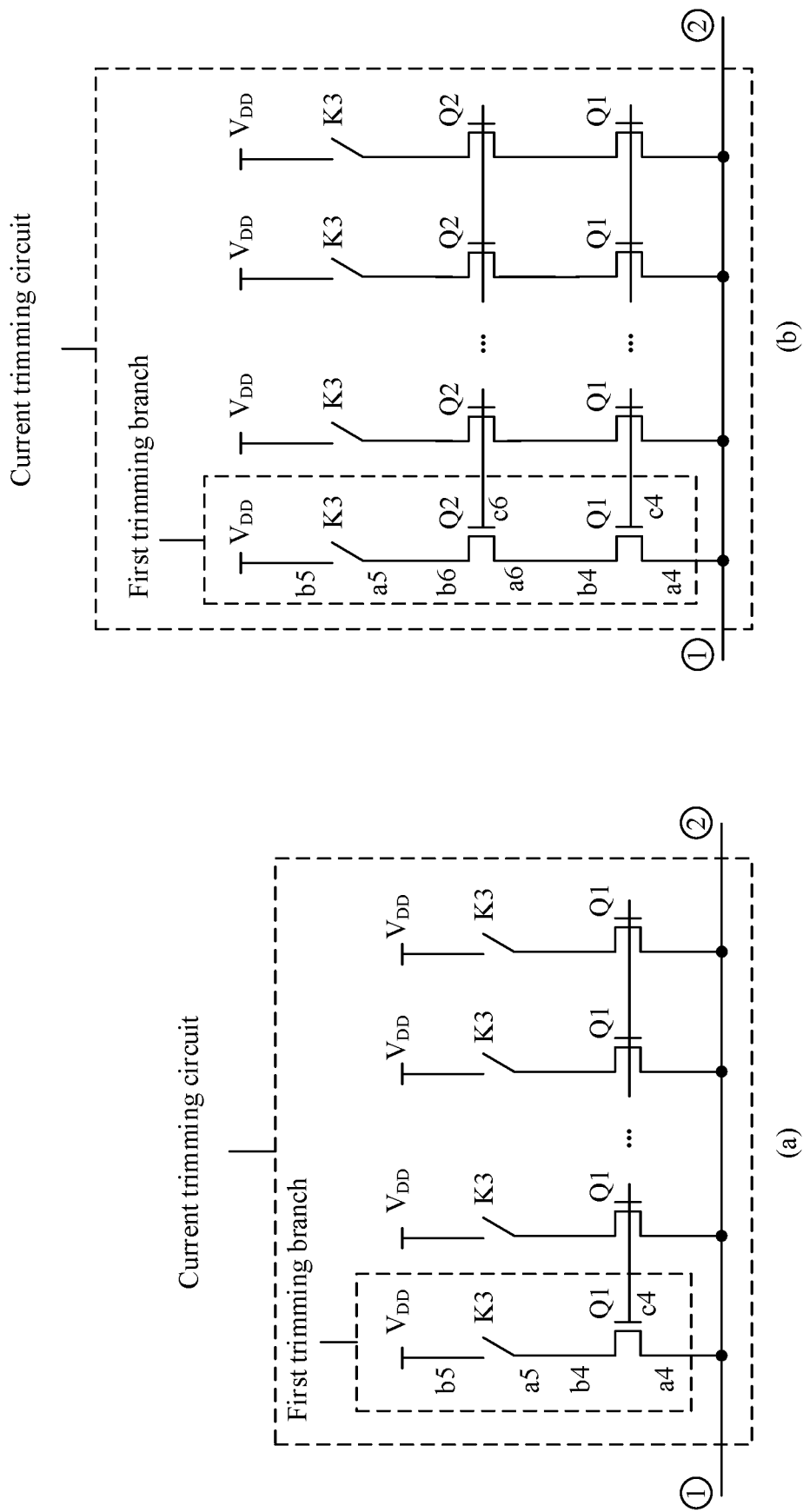
FIG. 7 is a schematic diagram of a structure of a current trimming circuit according to an embodiment of this application.

In an implementation, with reference to FIG. 6, as shown in (a) in FIG. 7, the current trimming circuit includes M first trimming branches, M is an integer greater than or equal to 1, and each first trimming branch includes a third switch K3 and a first transistor Q1 connected in series to the third switch K3. A first terminal a4 of the first transistor Q1 is coupled to the second terminal b2 of the first switch K1 and the second terminal b3 of the second switch K2, a second terminal b4 of the first transistor Q1 is coupled to a first terminal a5 of the third switch K3, a second terminal b5 of the third switch K3 is coupled to a power supply $V_{DD}$, and third terminals c4 of first transistors Q1 in the M first trimming branches are coupled to each other.

It may be understood that, in (a) in FIG. 7, the third terminals c4 of the first transistors Q1 in all the first trimming branches are coupled to each other, so that different first trimming branches have a same equivalent resistance.

Optionally, as shown in (b) in FIG. 7, each first trimming branch may further include a second transistor Q2, a first terminal a6 of the second transistor Q2 is coupled to the second terminal b4 of the first transistor Q1, a second terminal b6 of the second transistor Q2 is coupled to the first terminal a5 of the third switch K3, and third terminals c6 of second transistors Q2 in the M first trimming branches are coupled to each other.

It may be understood that, in (b) in FIG. 7, the third terminals c4 of the first transistors Q1 in all the first trimming branches are coupled to each other, and the third terminals c6 of the second transistors Q2 are coupled to each other, so that different first trimming branches have a same equivalent resistance.

Optionally, a difference between the first trimming branch shown in (a) in FIG. 7 and the first trimming branch shown in (b) in FIG. 7 lies in that quantities of transistors included in the two trimming branches are different, and therefore equivalent resistances of the two trimming branches are different. Optionally, each first trimming branch may further include three or more transistors. The plurality of transistors are connected in series to the third switch K3, and third terminals of transistors at corresponding positions in the M first trimming branches may be coupled to each other, so that different first trimming branches have a same equivalent resistance. A specific quantity of transistors included in the first trimming branch is not limited in this embodiment of this application. In (a) in FIG. 7, an example in which the first trimming branch includes only one transistor (Q1) is used for illustration. In (b) in FIG. 7, an example in which the first trimming branch includes only two transistors (Q1 and Q2) is used for illustration. In actual application, a quantity of transistors in the first trimming branch may be set based on a chip requirement.

According to trimming manners provided by the current trimming circuit shown in (a) in FIG. 7 and the current trimming circuit shown in (b) in FIG. 7, when the first switch K1 or the second switch K2 is turned on, the first trimming branch may be used for shunting, to reduce a current of a trimmed branch. The trimmed branch may be a data branch, or may be a reference branch. For example, when the first switch K1 is turned on, the trimmed branch is a data branch, or when the second switch K2 is turned on, the trimmed branch is a reference branch. It may be understood that, with reference to the current trimming circuit shown in FIG. 7, when the current of the reference branch is greater than $I_H$, the trimmed branch is a reference branch, or when the current of the reference branch is less than $I_L$, the trimmed branch is a data branch.

For example, with reference to FIG. 6 and FIG. 7, when the current $I_{REF}$ of the reference branch is greater than $I_H$, the second switch K2 and the third switch K3 in the first trimming branch may be turned on, so that the current $I_{REF}$ of the reference branch may be shunt to the first trimming branch. In this way, the current $I_{REF}$ of the reference branch is reduced, and the current $I_{REF}$ of the reference branch is no longer greater than $I_H$.

For another example, with reference to FIG. 6 and FIG. 7, when the current $I_{REF}$ of the reference branch is less than $I_L$, the first switch K1 and the third switch K3 in the first trimming branch may be turned on, so that the current $I_D$ of the data branch may be shunt to the first trimming branch, thereby reducing the current $I_D$ of the data branch. This is equivalent to increasing the current $I_{REF}$ of the reference branch, so that the current $I_{REF}$ of the reference branch is no longer less than $I_L$.

It may be understood that a plurality of first trimming branches in the current trimming circuit may provide trimming of different levels. For example, when the current $I_{REF}$ of the reference branch is greater than $I_H$ to a greater extent, third switches K3 in more first trimming branches may be turned on, so that the current $I_{REF}$ of the reference branch may be shunt to the more first trimming branches, and the shunt current $I_{REF}$ of the reference branch may be within the REF window. When the current $I_{REF}$ of the reference branch is greater than $I_H$ to a lesser extent, third switches K3 in fewer first trimming branches may be turned on, so that the current $I_{REF}$ of the reference branch may be shunt to the fewer first trimming branches, and the current $I_{REF}$ of the reference branch may be within the REF window. Optionally, level information of the current trimming branch and information about trimming the data branch or reference branch may be written into a one-time programmable memory after a chip is tested before delivery.

Figure 8:
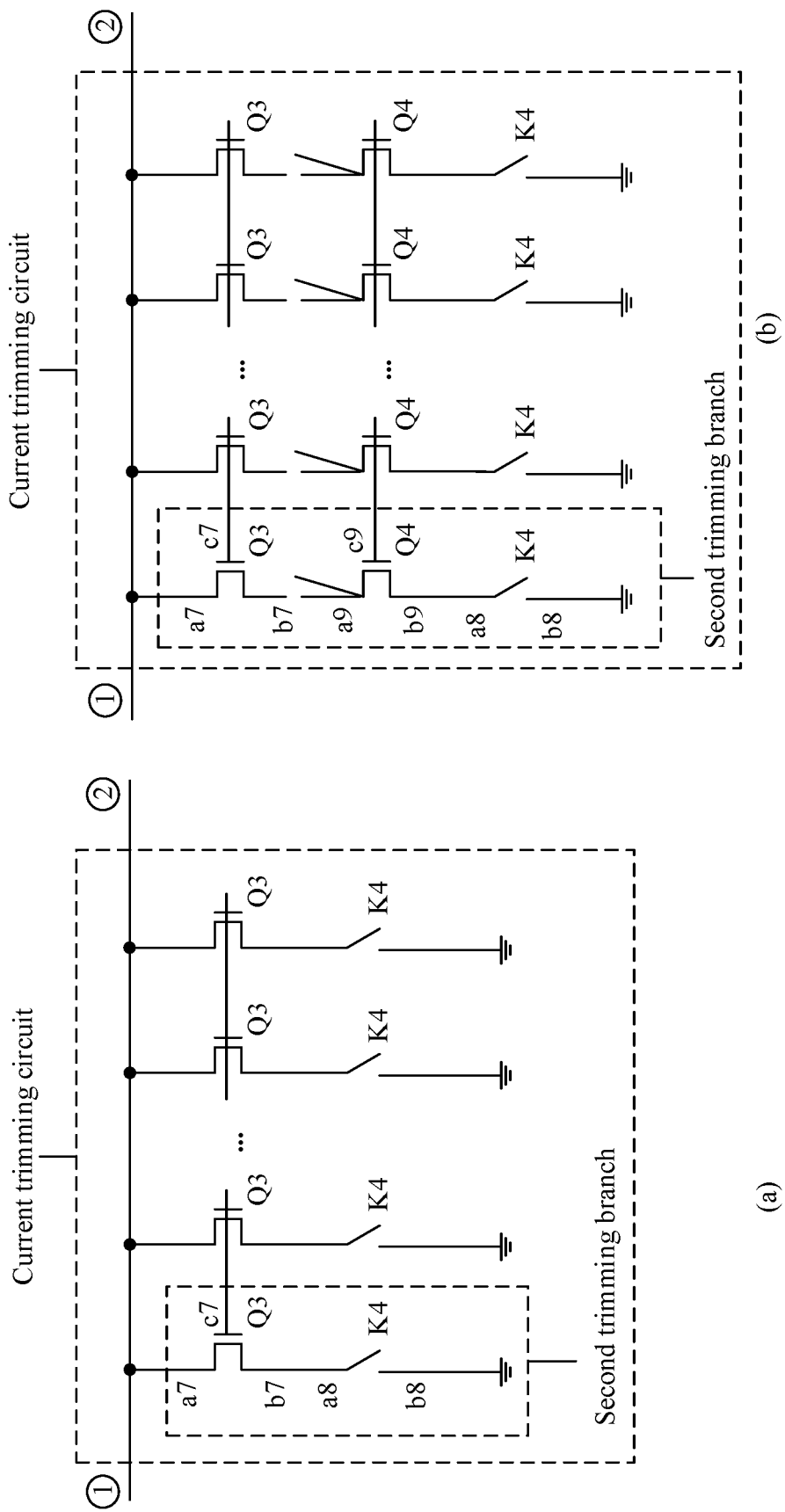
FIG. 8 is a schematic diagram of a structure of another current trimming circuit according to an embodiment of this application.

In another implementation, with reference to FIG. 6, as shown in (a) in FIG. 8, the current trimming circuit includes N second trimming branches, N is an integer greater than or equal to 1, and each second trimming branch includes a fourth switch K4 and a third transistor Q3 connected in series to the fourth switch K4. A first terminal a7 of the third transistor Q3 is coupled to the second terminal b2 of the first switch K1 and the second terminal b3 of the second switch K2, a second terminal b7 of the third transistor Q3 is coupled to a first terminal a8 of the fourth switch K4, a second terminal b8 of the fourth switch K4 is grounded, and third terminals c7 of third transistors Q3 in the N second trimming branches are coupled to each other. Optionally, values of M and N may be the same or may be different.

It may be understood that, in (a) in FIG. 8, the third terminals c7 of the third transistors Q3 in all the second trimming branches are coupled to each other, so that different second trimming branches have a same equivalent resistance.

Optionally, as shown in (b) in FIG. 8, each second trimming branch may further include a fourth transistor Q4. A first terminal a9 of the fourth transistor Q4 is coupled to the second terminal b7 of the third transistor, a second terminal b9 of the fourth transistor Q4 is coupled to the first terminal a8 of the fourth switch K4, and third terminals c9 of fourth transistors Q4 in the N second trimming branches are coupled to each other.

It may be understood that, in (b) in FIG. 8, the third terminals c7 of the third transistors Q3 in all the second trimming branches are coupled to each other, and the third terminals c9 of the fourth transistors Q4 are coupled to each other, so that different second trimming branches have a same equivalent resistance.

Optionally, a difference between the second trimming branch shown in (a) in FIG. 8 and the second trimming branch shown in (b) in FIG. 8 lies in that quantities of transistors included in the two trimming branches are different, and therefore equivalent resistances of the two trimming branches are different. Optionally, each second trimming branch may further include three or more transistors. The plurality of transistors are connected in series, and third terminals of transistors at corresponding positions in the N second trimming branches may be coupled to each other, so that different second trimming branches have a same equivalent resistance. A specific quantity of transistors included in the second trimming branch is not limited in this embodiment of this application. In (a) in FIG. 8, an example in which the second trimming branch includes only one transistor (Q3) is used for illustration. In (b) in FIG. 8, an example in which the second trimming branch includes only two transistors (Q3 and Q4) is used for illustration. In actual application, a quantity of transistors in the second trimming branch may be set based on a chip requirement.

In trimming manners provided by the current trimming circuit shown in (a) in FIG. 8 and the current trimming circuit shown in (b) in FIG. 8, when the first switch K1 or the second switch K2 is turned on, a current of a trimmed branch may be increased. The trimmed branch may be a data branch, or may be a reference branch. For example, when the first switch K1 is turned on, the trimmed branch is a data branch, or when the second switch K2 is turned on, the trimmed branch is a reference branch. It may be understood that, with reference to the current trimming circuit shown in FIG. 8, when the current of the reference branch is greater than $I_H$, the trimmed branch is a data branch, or when the current of the reference branch is less than $I_L$, the trimmed branch is a reference branch.

For example, with reference to FIG. 6 and FIG. 8, when the current $I_{REF}$ of the reference branch is greater than $I_H$, the first switch K1 and the fourth switch K4 in the second trimming branch may be turned on, so that the current $I_D$ of the data branch is a sum of a current on the data cell and a current on the second trimming branch. Therefore, the current $I_D$ of the data branch is increased. This is equivalent to reducing the current $I_{REF}$ of the reference branch, so that the current $I_{REF}$ of the reference branch is no longer greater than $I_H$.

For another example, with reference to FIG. 6 and FIG. 8, when the current $I_{REF}$ of the reference branch is less than $I_L$, the second switch K2 and the fourth switch K4 in the second trimming branch may be turned on, so that the current $I_{REF}$ of the reference branch is a sum of a current on the reference cell and a current on the second trimming branch. Therefore, the current $I_{REF}$ of the reference branch is increased, and the current $I_{REF}$ of the reference branch is no longer less than $I_L$.

It may be understood that a plurality of second trimming branches in the current trimming circuit may provide trimming of different levels. For example, when the current $I_{REF}$ of the reference branch is less than $I_L$ to a greater extent, the second switch K2 and fourth switches K4 in more second trimming branches may be turned on, so that the current $I_{REF}$ of the reference branch is a sum of the current on the reference cell and currents on the more second trimming branches. In addition, the current $I_{REF}$ of the reference branch is increased to a greater extent, so that the current $I_{REF}$ of the reference branch may be within the REF window. When the current $I_{REF}$ of the reference branch is less than $I_L$ to a lesser extent, the second switch K2 and fourth switches K4 in fewer second trimming branches may be turned on, so that the current $I_{REF}$ of the reference branch is a sum of the current on the reference cell and currents on the fewer second trimming branches. In addition, the current $I_{REF}$ of the reference branch is increased to a lesser extent, so that the current $I_{REF}$ of the reference branch may be within the REF window. Optionally, level information of the current trimming branch and information about trimming the data branch or reference branch may be written into a one-time programmable memory after a chip is tested before delivery.

It may be understood that, in the data reading circuit provided in this application, when the current of the reference branch is greater than $I_H$ or less than $I_L$, the first switch or the second switch may be turned on, and a current value of the reference branch or the data branch may be trimmed through the current trimming circuit, so that the current of the reference branch falls within the ideal REF window. Compared with the conventional technology in which one trimming circuit is disposed on each of the data branch and the reference branch, one trimming circuit trims the current of the data branch, and one trimming circuit trims the current of the reference branch, in this application, only one current trimming circuit is disposed to trim the current of the data branch or the current of the reference branch. Therefore, the board area occupied by the trimming circuit is reduced.

Optionally, the data reading circuit provided in this application may include one or more data cells, and the data reading circuit may include one or more reference cells. This is not limited in this embodiment of this application. In FIG. 6, only an example in which the data reading circuit includes one data cell and one reference cell is used for description.

Optionally, when the data reading circuit includes a plurality of data cells and one reference cell, each data cell in the plurality of data cells is coupled to one word line WL, and the WL is configured to select one data cell.

Figure 9:
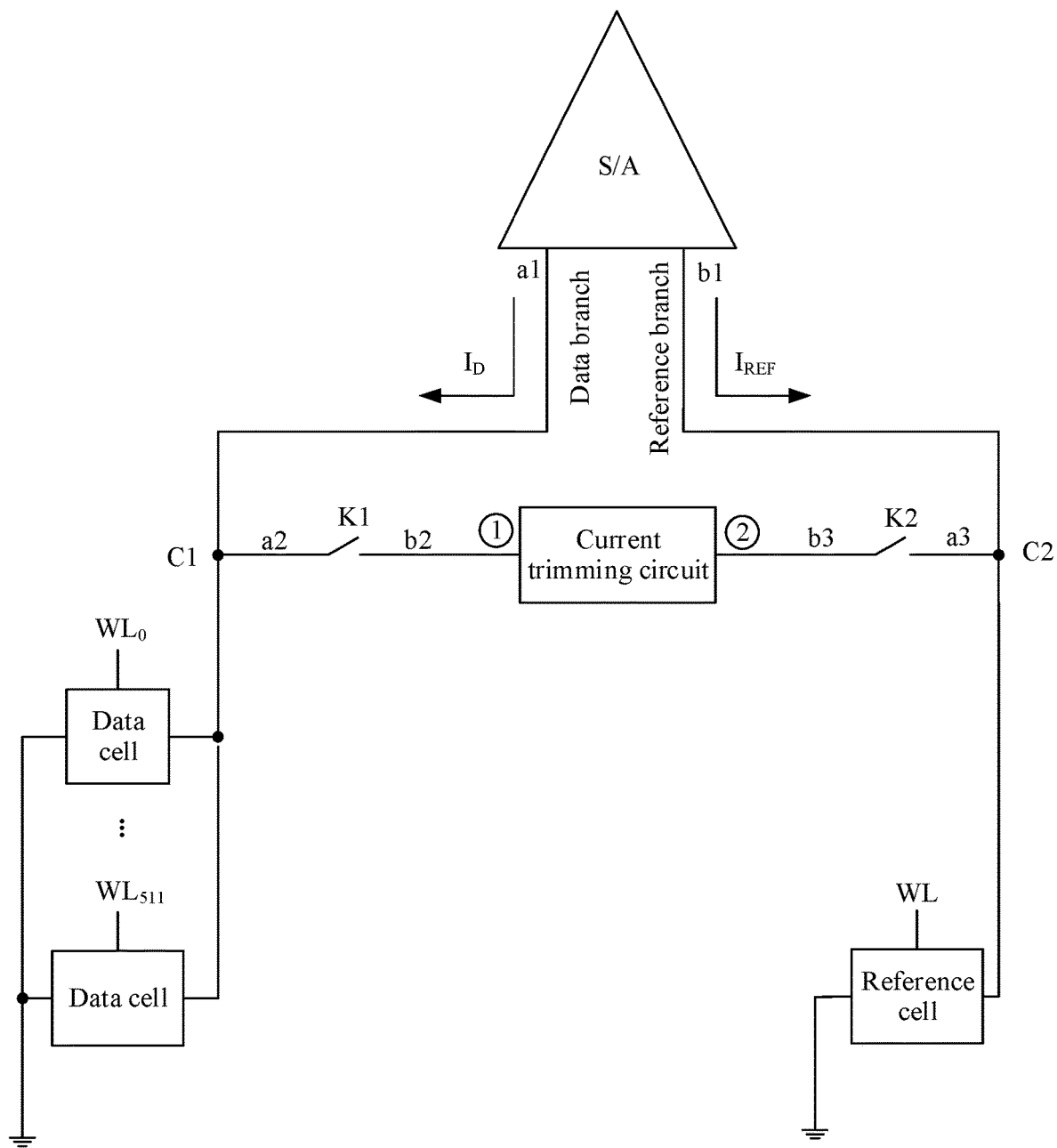
FIG. 9 is a schematic diagram of a structure of another data reading circuit according to an embodiment of this application.

For example, as shown in FIG. 9, the data reading circuit includes 512 data cells, each data cell is coupled to one word line, the 512 data cells are respectively coupled to word lines $WL_0$ to $WL_{511}$, and each word line is used to select one data cell to perform a read operation.

Optionally, the data reading circuit may alternatively include two data cell groups and two reference cells, and each data cell group includes a plurality of data cells. The plurality of data cells in each data cell group are coupled to one bit line multiplexer BLMUX and one source line multiplexer SLMUX, and each data cell is coupled to one word line WL. The BLMUX and the SLMUX are used to select one bit line and one source line respectively, and the WL is used to select one data cell.

Figure 10:
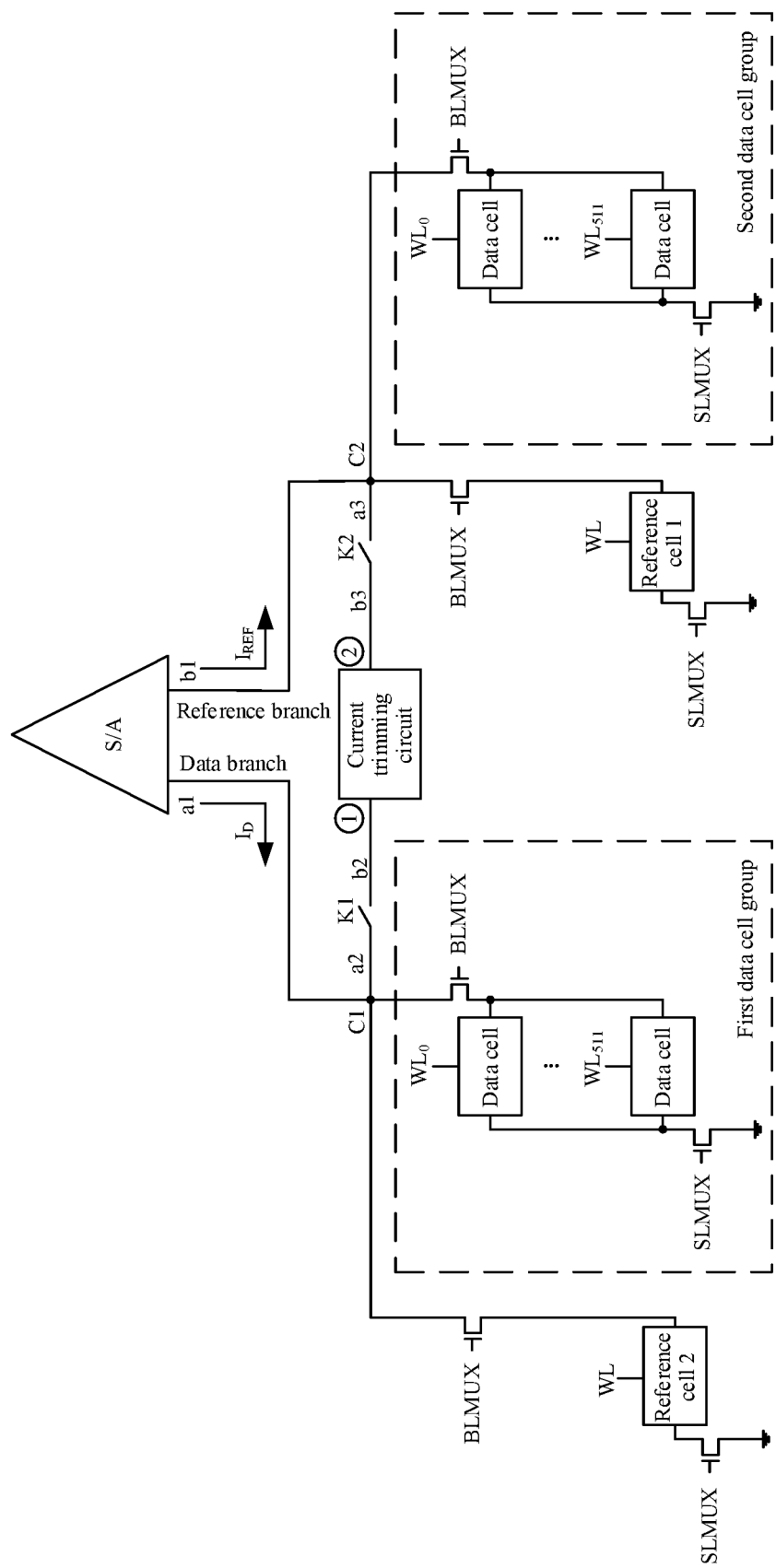
FIG. 10 is a schematic diagram of a structure of another data reading circuit according to an embodiment of this application.

For example, as shown in FIG. 10, the data reading circuit includes two data cell groups: a first data cell group and a second data cell group, two reference cells are respectively a reference cell 1 and a reference cell 2, the first data cell group and the second data cell group each include 512 data cells, and the 512 data cells are respectively coupled to word lines $WL_0$ to $WL_{511}$. When a data cell in the first data cell group is read, the data cell and the reference cell 1 are selected, the data cells in the second data cell group and the reference cell 2 are not selected, and $I_D$ and $I_{REF}$ are compared to output a high/low level signal. When a data cell in the second data cell group is read, the data cell and the reference cell 2 are selected, the data cells in the first data cell group and the reference cell 1 are not selected, and $I_D$ and $I_{REF}$ are compared to output a high/low level signal. It may be understood that a data cell or a reference cell may be selected or not selected through the BLMUX, the SLMUX, and the WL.

Figure 11:
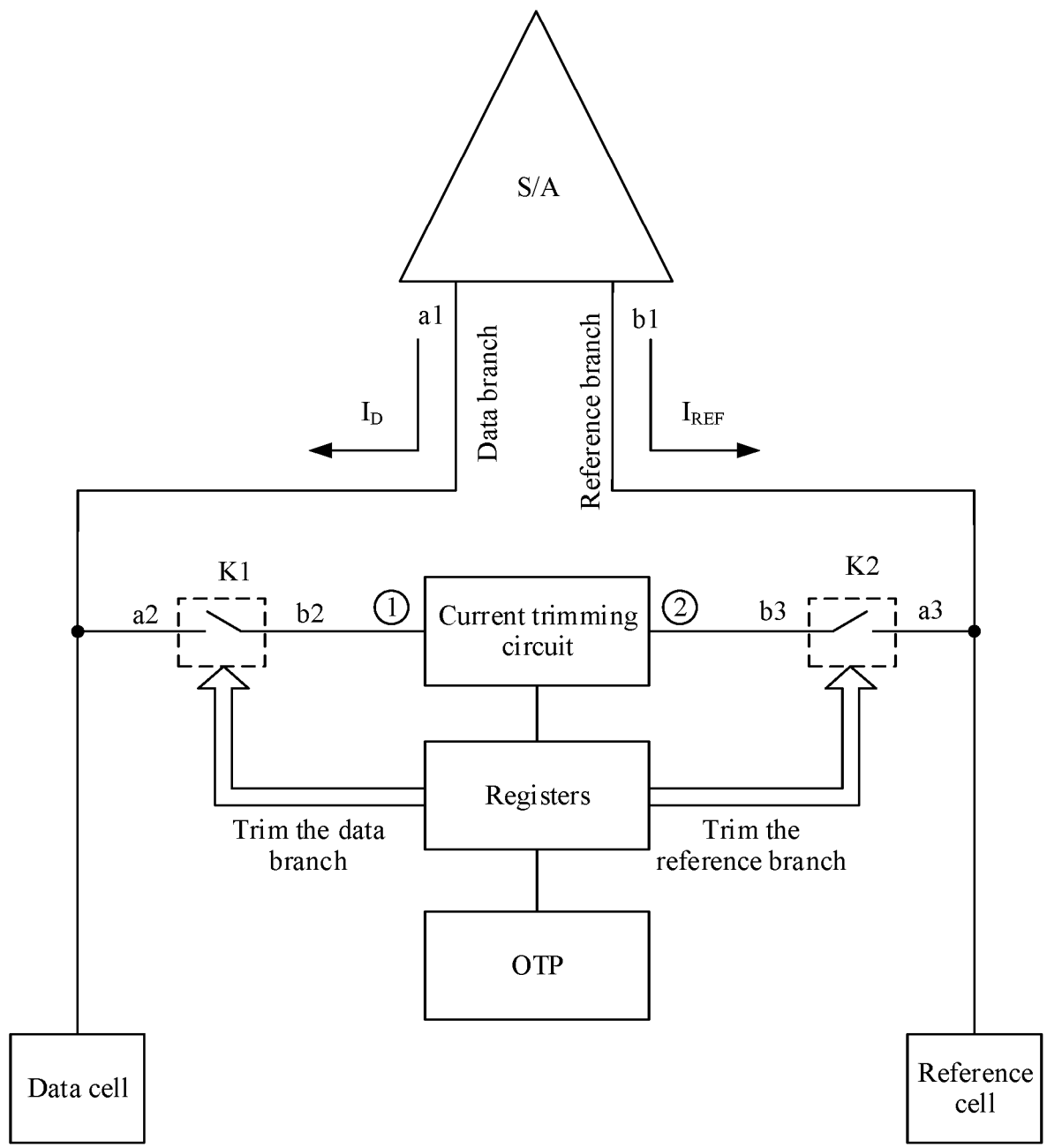
FIG. 11 is a schematic diagram of a structure of another data reading circuit according to an embodiment of this application.

Optionally, as shown in FIG. 11, the data reading circuit further includes registers and the one-time programmable memory coupled to the registers. The registers are coupled to the first switch K1, the second switch K2, and the current trimming circuit. The registers are configured to: obtain control information from the one-time programmable memory; and control the first switch K1 and the current trimming circuit based on the control information, or control the second switch K2 and the current trimming circuit based on the control information. The control information includes control manners of the first switch K1 and the current trimming circuit, or includes control manners of the second switch K2 and the current trimming circuit. Optionally, after the chip is tested before delivery, the control information may be written into the one-time programmable memory, where the one-time programmable memory may be (OTP) or an eFuse.

For example, when the current trimming circuit in the data reading circuit is the circuit shown in FIG. 7, when the current of the reference branch is greater than $I_H$, the control information includes turning on the second switch K2 and third switches K3 in J1 first trimming branches, where J1 is an integer greater than or equal to 1 and less than or equal to M. When the current of the reference branch is less than $I_L$, the control information includes turning on the first switch K1 and third switches K3 in P1 first trimming branches, where P1 is an integer greater than or equal to 1 and less than or equal to M. J1 and P1 are level information, and values of J1 and P1 are different depending on a degree to which the current of the reference branch is greater than $I_H$ or less than $I_L$.

For example, when the current trimming circuit in the data reading circuit is the circuit shown in FIG. 8, when the current of the reference branch is greater than $I_H$, the control information includes turning on the first switch K1 and fourth switches K4 in P2 second trimming branches, where P2 is an integer greater than or equal to 1 and less than or equal to N. When the current of the reference branch is less than $I_L$, the control information includes turning on the second switch K2 and fourth switches K4 in J2 second trimming branches, where J2 is an integer greater than or equal to 1 and less than or equal to N. J2 and P2 are level information, and values of J2 and P2 are different depending on a degree to which the current of the reference branch is greater than $I_H$ or less than $I_L$.

Optionally, the registers may obtain the control information from the one-time programmable memory at the beginning of a read period, and control the data read circuit based on the control information, so that the current of the reference branch may be within the ideal REF window.

Optionally, when the read period ends, the registers may turn off the first switch and a switch in the current trimming circuit, or turn off the second switch and a switch in the current trimming circuit.

According to the data reading circuit provided in this application, when the current of the reference branch is greater than $I_H$ or less than $I_L$, the first switch or the second switch may be controlled through the registers, and the current value of the reference branch or the data branch may be trimmed through the current trimming circuit, so that the current of the reference branch may be within the ideal REF window.

Figure 12:
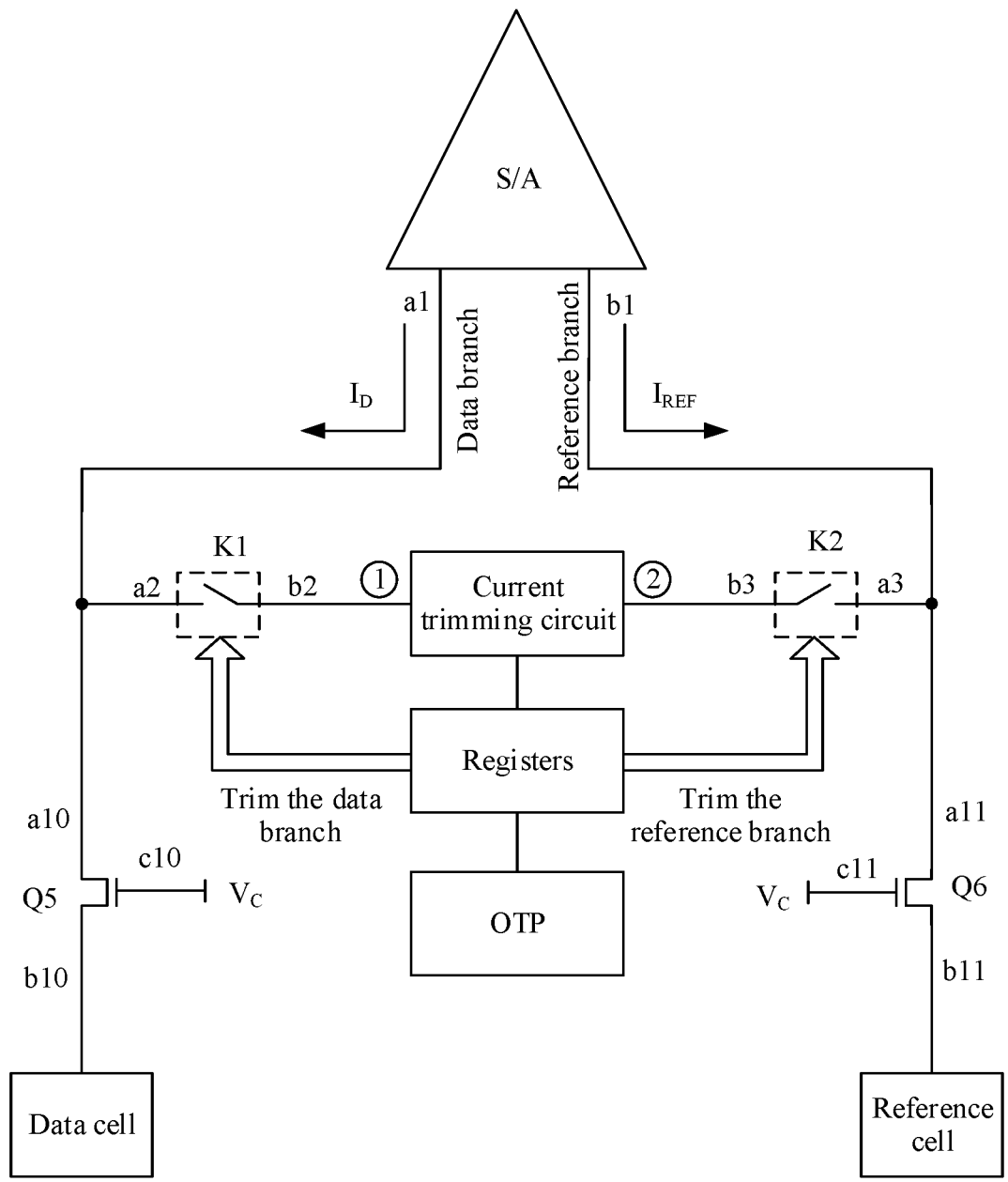
FIG. 12 is a schematic diagram of a structure of another data reading circuit according to an embodiment of this application.

Optionally, as shown in FIG. 12, the data reading circuit may further include a fifth transistor Q5 and a sixth transistor Q6. A first terminal a10 of the fifth transistor Q5 is coupled to the first terminal a2 of the first switch K1, a second terminal b10 of the fifth transistor Q5 is coupled to the data cell, and a third terminal c10 of the fifth transistor Q5 is coupled to a preset voltage $V_C$. A first terminal a11 of the sixth transistor Q6 is coupled to the first terminal a3 of the second switch K2, a second terminal b11 of the sixth transistor Q6 is coupled to the reference cell, and a third terminal c11 of the sixth transistor Q6 is coupled to the preset voltage $V_C$.

Optionally, the third terminal c10 of the fifth transistor Q5 and the third terminal c11 of the sixth transistor Q6 may be coupled to the preset voltage $V_C$.

It may be understood that the fifth transistor and the sixth transistor are coupled to the preset voltage, so that current values of the data cell and the reference cell can be controlled, and a fault of the reference cell or the data cell caused due to an excessively high current can be avoided.

Optionally, the first transistor Q1 to the sixth transistor Q6 may be field-effect transistors (FETs), for example, metal-oxide semiconductor field-effect transistors (MOSFETs). Optionally, the first switch K1 to the fourth switch K4 may also be MOSFETs.

In the data reading circuit provided in this application, when the current of the reference branch is greater than $I_H$ or less than $I_L$, the first switch or the second switch may be turned on, and the current value of the data branch or the reference branch may be trimmed through the current trimming circuit, so that the current of the reference branch falls within the ideal REF window. That is, in this application, only one current trimming circuit is disposed to trim the current of the data branch or the current of the reference branch. Therefore, the board area occupied by the trimming circuit is reduced. In addition, the first switch and the second switch are disposed, so that the parasitic capacitors at the first node C1 and the second node C2 are reduced, and the read speed of the S/A is increased.

Figure 13:
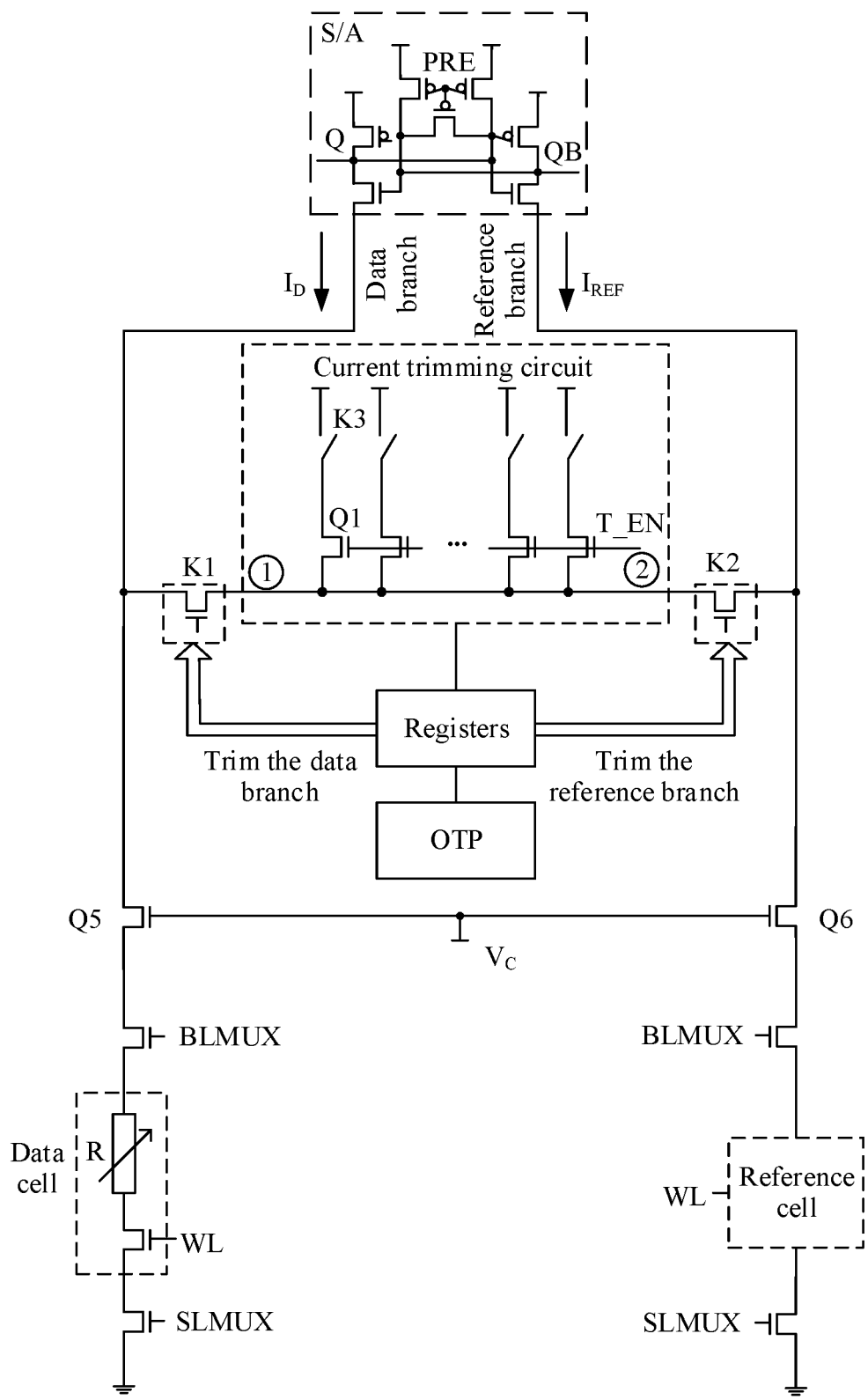
FIG. 13 is a schematic diagram of a structure of another data reading circuit according to an embodiment of this application.
Figure 14:
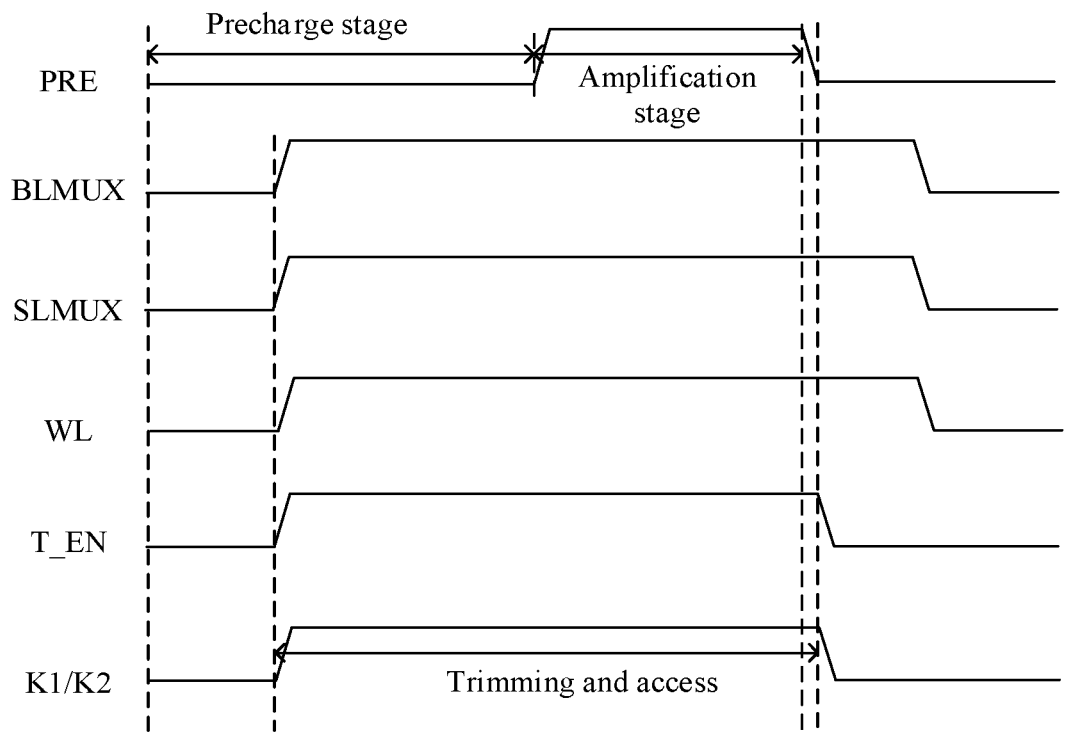
FIG. 14 is a schematic diagram of a time sequence of a signal in a data reading circuit according to an embodiment of this application.

For example, as shown in FIG. 13, an example in which the S/A in the data reading circuit is of a cross-coupled inverter structure is used to describe a working process of the data reading circuit provided in this application with reference to waveforms of signals shown in FIG. 14.

With reference to FIG. 13 and FIG. 14, when a PRE signal in the cross-coupled inverter is at a low potential, Q and QB are forcibly pre-charged to a same potential. The BLMUX, the SLMUX, and the WL are increased from an initial low potential to a high potential, and the data cell and the reference cell are connected to the reading circuit. Because resistance values of the data branch and the reference branch are different, after a period of time, the current $I_D$ of the data branch and the current $I_{REF}$ of the reference branch form a stable current signal with a difference in value. This stage may be referred to as a pre-charge stage. After the PRE signal changes to a high level, an amplification stage of the S/A starts. Because the current $I_D$ of the data branch and the current $I_{REF}$ of the reference branch make discharge speeds on the two branches different, Q and QB of the cross-coupled inverter generate a small voltage difference. Then, the S/A amplifies the voltage difference through positive feedback, and finally outputs a rail-to-rail high/low level signal.

As shown in FIG. 14, in the process of reading the data cell, the current trimming circuit works in the pre-charge stage of the S/A. A T_EN signal and the first switch K1 or the second switch K2 are activated together with the BLMUX, the SLMUX, and the WL, and the current trimming circuit is connected to the data reading circuit, so that the current of the data branch or the current of the reference branch can be trimmed.

Figure 15:
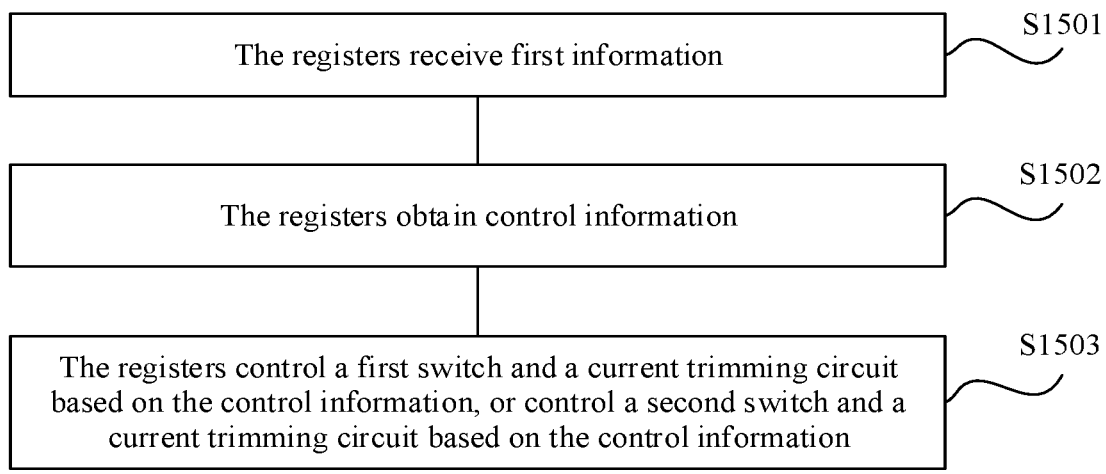
FIG. 15 is a schematic flowchart of a data reading circuit control method according to an embodiment of this application.

An embodiment of this application further provides a data reading circuit control method. A data reading circuit may be the data reading circuit shown in any one of FIG. 11 to FIG. 13, and a current trimming circuit in the data reading circuit may be the current trimming circuit shown in FIG. 7 or FIG. 8. As shown in FIG. 15, the control method includes steps S1501 to S1503.

(Optional) S1501: The registers receive first information. The first information indicates that a read period starts.

For example, when an S/A starts to read a data cell, the registers receives the first information indicating that the read period starts.

S1502: The registers obtains control information.

The control information includes control manners of a first switch K1 and the current trimming circuit, or includes control manners of a second switch K2 and the current trimming circuit.

Optionally, the foregoing step S1502 may include: The registers obtains the control information from a one-time programmable memory based on the first information.

For example, when the current trimming circuit in the data reading circuit is the current trimming circuit shown in FIG. 7, when a current of a reference branch is greater than $I_H$, the control information includes turning on the second switch K2 and third switches K3 in J1 first trimming branches, where J1 is an integer greater than or equal to 1 and less than or equal to M. When a current of a reference branch is less than $I_L$, the control information includes turning on the first switch K1 and third switches K3 in P1 first trimming branches, where P1 is an integer greater than or equal to 1 and less than or equal to M.

For example, when the current trimming circuit in the data reading circuit is the current trimming circuit shown in FIG. 8, when a current of a reference branch is greater than $I_H$, the control information includes turning on the first switch K1 and fourth switches K4 in P2 second trimming branches, where P2 is an integer greater than or equal to 1 and less than or equal to N. When a current of a reference branch is less than $I_L$, the control information includes turning on the second switch K2 and fourth switches K4 in J2 second trimming branches, where J2 is an integer greater than or equal to 1 and less than or equal to N.

Optionally, the control information stored in the one-time programmable memory may be written after being tested before a chip is delivered from a factory. In other words, whether a branch to be trimmed is a data branch or a reference branch, and specific level information (J1, P1, P2, and J2) in the current trimming circuit are all obtained through a chip test.

S1503: The registers control the first switch and the current trimming circuit based on the control information, or controls the second switch and the current trimming circuit based on the control information.

Optionally, when the read period starts, the registers may turn on the first switch and a switch in the current trimming circuit based on the control information, or turn on the second switch and a switch in the current trimming circuit based on the control information.

For example, when the current trimming circuit in the data reading circuit is the current trimming circuit shown in FIG. 7, if the current of the reference branch is greater than $I_H$, the foregoing step S1503 includes: The registers turn on the second switch K2 and the third switches K3 in the J1 first trimming branches. If the current of the reference branch is less than $I_L$, the foregoing step S1503 includes: The registers turn on the first switch K1 and the third switches K3 in the P1 first trimming branches.

For example, when the current trimming circuit in the data reading circuit is the current trimming circuit shown in FIG. 8, if the current of the reference branch is greater than $I_H$, the foregoing step S1503 includes: The registers turn on the first switch K1 and the fourth switches K4 in the P2 second trimming branches. If the current of the reference branch is less than $I_L$, the foregoing step S1503 includes: The registers turn on the second switch K2 and the fourth switches K4 in the J2 second trimming branches.

A current $I_{REF}$ of the reference branch falls within a REF window in an ideal state, so that a current $I_D$ of the data branch may be classified into a high current $I_H$ and a low current $I_L$, and the data cell is accurately read. However, because a transistor has a process deviation, it cannot be ensured that the current $I_{REF}$ of the reference branch falls within the ideal REF window.

Figure 16:
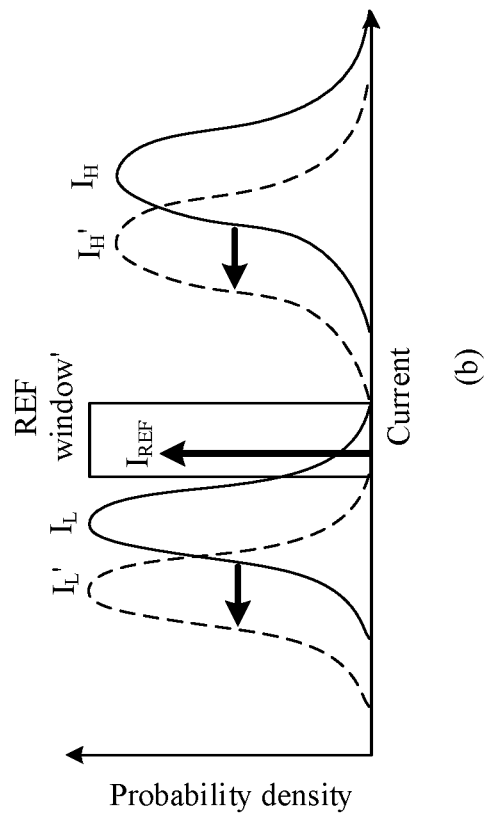
FIG. 16 is a schematic diagram of control effect of a data reading circuit according to an embodiment of this application.
Figure 16:
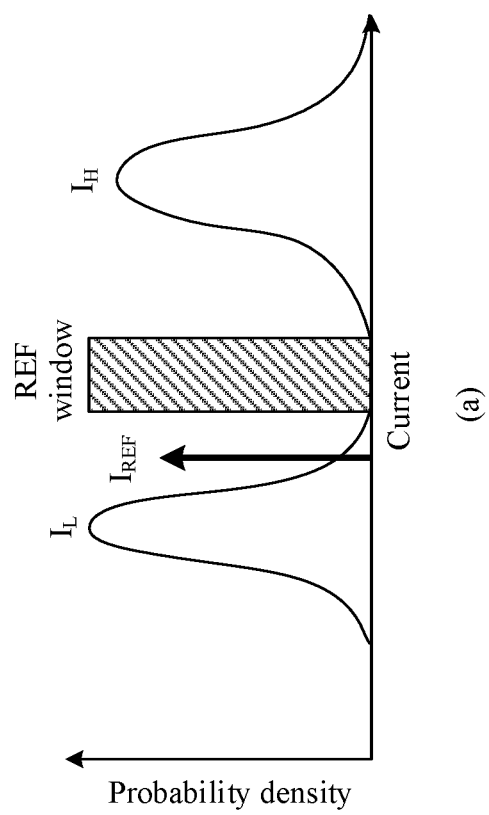

For example, as shown in (a) in FIG. 16, the current $I_{REF}$ of the reference branch falls outside the REF window, and is less than an ideal value. In this case, a part of $I_L$ is greater than $I_{REF}$, and consequently, the data cell is incorrectly read. An example in which the data reading circuit is the circuit shown in FIG. 13 is used. As shown in FIG. 13, the current trimming circuit in the data reading circuit is the current trimming circuit shown in (a) in FIG. 7. If the current $I_{REF}$ of the reference branch is less than $I_L$, after obtaining the control information, the registers turn on the first switch K1 and the third switches K3 in the P1 first trimming branches. In this case, the current $I_D$ of the data branch is reduced because the current $I_D$ is shunted through parallel connection, which is equivalent to increasing the current $I_{REF}$ of the reference branch. As shown in (b) in FIG. 16, trimmed currents $I_{H'}$ and $I_{L'}$ (shown by dashed lines in (b) in FIG. 16) of the data branch are reduced compared with the currents $I_H$ and $I_L$ (shown by solid lines in (b) in FIG. 16) of the data branch before trimming, so that $I_{REF}$ may be between $I_{H'}$ and $I_{L'}$, and the current $I_{REF}$ of the reference branch falls within a new REF window' (REF window' in (b) in FIG. 16). Therefore, the data cell can be correctly read.

Figure 17:
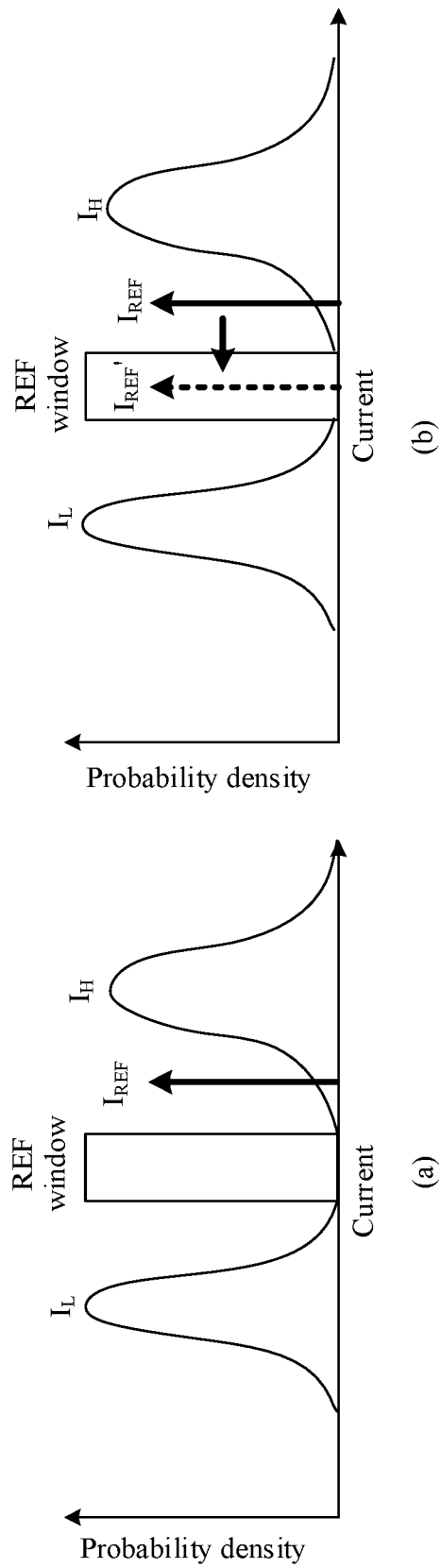
FIG. 17 is a schematic diagram of control effect of another data reading circuit according to an embodiment of this application.

For another example, as shown in (a) in FIG. 17, the current $I_{REF}$ of the reference branch falls outside the REF window, and is greater than an ideal value. In this case, a part of $I_H$ is less than $I_{REF}$, and consequently, the data cell is incorrectly read. An example in which the data reading circuit is the circuit shown in FIG. 13 is used. As shown in FIG. 13, the current trimming circuit in the data reading circuit is the current trimming circuit shown in (a) in FIG. 7. If the current $I_{REF}$ of the reference branch is greater than $I_H$, after obtaining the control information, the registers turn on the second switch K2 and the third switches K3 in the J1 first trimming branches. In this case, the current $I_{REF}$ of the reference branch is reduced because the current $I_{REF}$ is shunted through parallel connection. As shown in (b) in FIG. 17, a trimmed current $I_{REF}$ of the reference branch is reduced compared with the current $I_{REF}$ of the reference branch before trimming, the trimmed current $I_{REF}$ of the reference branch falls within the REF window, and $I_{REF}$ is between $I_H$ and $I_L$. Therefore, the data cell can be correctly read.

According to the data reading circuit control method provided in this embodiment of this application, when a read operation is performed on the data cell, the registers obtain the control information from the one-time programmable memory, so that the current of the data branch or the current of the reference branch can be trimmed. In this way, the current of the reference branch falls within the ideal REF window, and the data of the data cell can be accurately read. In this solution, when the current of the reference branch is greater than $I_H$ or less than $I_L$, the first switch or the second switch may be controlled through the registers, and a current value of the reference branch or the data branch may be trimmed through the current trimming circuit, so that the current of the reference branch falls within the ideal REF window. That is, in this solution, only one current trimming circuit is disposed to trim the current of the data branch or the current of the reference branch, thereby reducing a board area occupied by the trimming circuit and increasing a read speed of the S/A.

Figure 18:
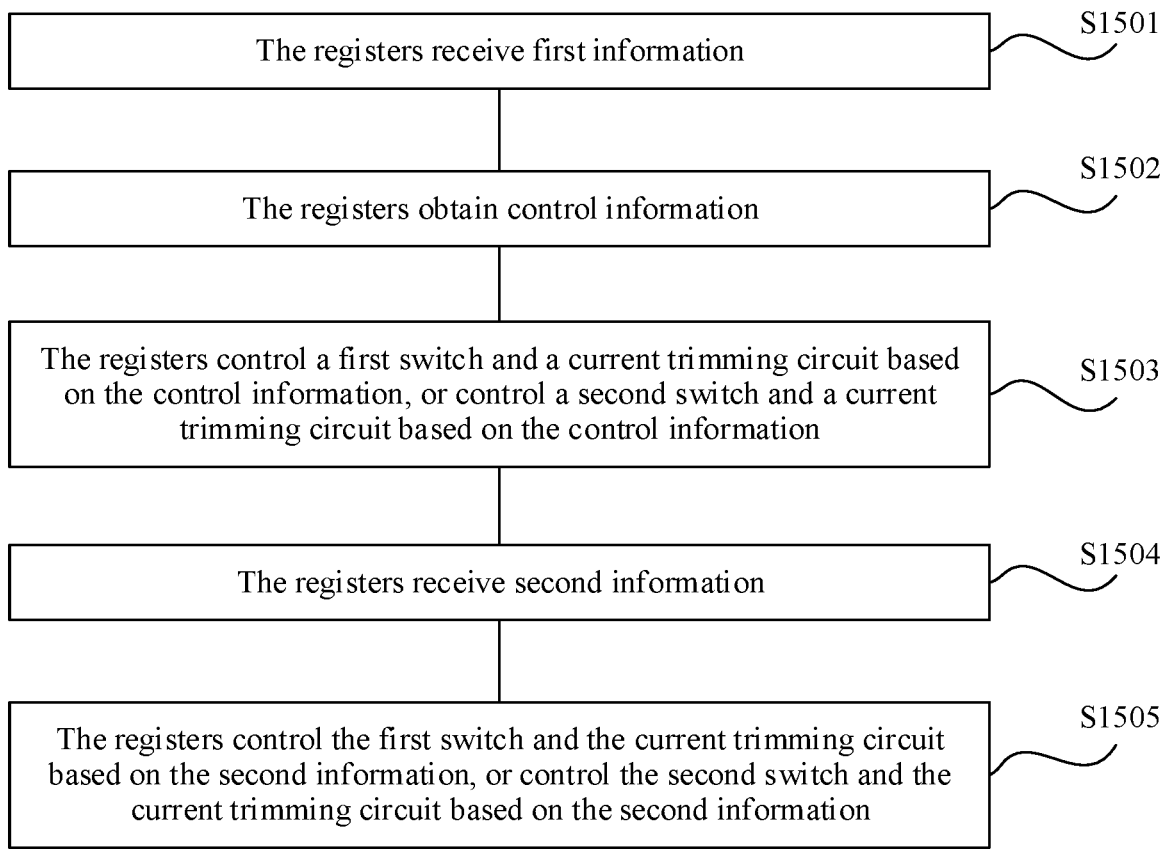
FIG. 18 is a schematic flowchart of another data reading circuit control method according to an embodiment of this application.

An embodiment of this application further provides a data reading circuit control method. A data reading circuit may be the data reading circuit shown in any one of FIG. 11 to FIG. 13, and a current trimming circuit in the data reading circuit may be the current trimming circuit shown in FIG. 7 or FIG. 8. As shown in FIG. 18, in addition to the foregoing steps S1501 to S1503, the control method may further include steps S1504 and S1505.

S1504: The registers receive the second information.

The second information indicates that the read period ends.

S1505: The registers control the first switch and the current trimming circuit based on the second information, or controls the second switch and the current trimming circuit based on the second information.

Optionally, when the read period ends, the registers may turn off the first switch and a switch in the current trimming circuit, or turn off the second switch and a switch in the current trimming circuit.

For example, when the current trimming circuit in the data reading circuit is the current trimming circuit shown in FIG. 7, if the current of the reference branch is greater than $I_H$, the foregoing step S1505 includes: The registers turn off the second switch K2 and the third switch K3 in the J1 first trimming branches based on the second information. If the current of the reference branch is less than $I_L$, the foregoing step S1505 includes: The registers turn off the first switch K1 and the third switch K3 in the P1 first trimming branches based on the second information.

For example, when the current trimming circuit in the data reading circuit is the current trimming circuit shown in FIG. 8, if the current of the reference branch is greater than $I_H$, the foregoing step S1505 includes: The registers turn off the first switch K1 and the fourth switches K4 in the P2 second trimming branches based on the second information. If the current of the reference branch is less than $I_L$, the foregoing step S1505 includes: The registers turn off the second switch K2 and the fourth switches K4 in the J2 second trimming branches based on the second information.

It may be understood that, in this solution, the current trimming circuit and the first switch or the second switch are turned off by ending the read period, so that when the data cell is read next time, a switch in the data reading circuit may be controlled again based on the control information, to accurately read the data cell.

According to the data reading circuit control method provided in this embodiment of this application, when a read operation is performed on the data cell, the registers obtain the control information from the one-time programmable memory, so that the current of the data branch or the current of the reference branch can be trimmed. In this way, the current of the reference branch falls within the ideal REF window, and the data of the data cell can be accurately read. In this solution, when the current of the reference branch is greater than $I_H$ or less than $I_L$, the first switch or the second switch may be controlled through the registers, and a current value of the reference branch or the data branch may be trimmed through the current trimming circuit, so that the current of the reference branch falls within the ideal REF window. That is, in this solution, only one current trimming circuit is disposed to trim the current of the data branch or the current of the reference branch, thereby reducing a board area occupied by the trimming circuit and increasing a read speed of the S/A. In addition, after reading ends, the registers turn off the current trimming circuit and the first switch or the second switch. When the data cell is read next time, a switch in the data reading circuit may be controlled again based on the control information, to accurately read the data cell.

An embodiment of this application further provides a storage device. The storage device includes a controller and any one of the foregoing data reading circuits. Optionally, the storage device may include a plurality of data reading circuits. A circuit structure of each data reading circuit may be the circuit shown in any one of FIG. 6, FIG. 9, FIG. 10, FIG. 11, FIG. 12, or FIG. 13, and a circuit structure of a current trimming circuit in the data reading circuit may be the circuit shown in FIG. 7 or FIG. 8. Circuit structures of current trimming circuits in different data reading circuits may be the same or may be different.

An embodiment of this application further provides a terminal device. The terminal device includes a processor and a memory, and the memory includes any one of the foregoing data reading circuits. Optionally, the memory may include one or more data reading circuits. A circuit structure of each data reading circuit may be the circuit shown in any one of FIG. 6, FIG. 9, FIG. 10, FIG. 11, FIG. 12, or FIG. 13, and a circuit structure of a current trimming circuit in the data reading circuit may be the circuit shown in FIG. 7 or FIG. 8. Circuit structures of current trimming circuits in different data reading circuits may be the same or may be different.

Method or algorithm steps described in combination with the content disclosed in this application may be implemented by hardware, or may be implemented by a processor by executing software instructions. The software instructions may include a corresponding software module. The software module may be stored in a random access memory (RAM), a flash memory, an erasable programmable read-only memory (EPROM), an electrically erasable programmable read-only memory (EEPROM), a register, a hard disk, a removable hard disk, a compact disc read-only memory (CD-ROM), or any other form of storage medium well-known in the art. For example, a storage medium is coupled to a processor, so that the processor can read information from the storage medium and write information into the storage medium. Certainly, the storage medium may alternatively be a component of the processor. The processor and the storage medium may be disposed in an ASIC. In addition, the ASIC may be located in a core network interface device. Certainly, the processor and the storage medium may alternatively exist in the core network interface device as discrete components.

A person skilled in the art should be aware that in the foregoing one or more examples, functions described in the present invention may be implemented by hardware, software, firmware, or any combination thereof. When the functions are implemented by software, these functions may be stored in a computer-readable medium or transmitted as one or more instructions or code in a computer-readable medium. The computer-readable medium includes a computer storage medium and a communication medium, where the communication medium includes any medium that enables a computer program to be transmitted from one place to another. The storage medium may be any available medium accessible to a general-purpose or special-purpose computer.

The objectives, technical solutions, and beneficial effect of the present invention are further described in detail in the foregoing specific embodiments. It should be understood that the foregoing descriptions are merely specific embodiments of the present invention, but are not intended to limit the protection scope of the present invention. Any modification, equivalent replacement, or improvement made based on the technical solutions of the present invention shall fall within the protection scope of the present invention.

What is claimed is:

1. A data reading circuit for reading a resistive random access memory, comprising:
a sense amplifier;
a first switch;
a second switch;
a current trimming circuit;
a data cell; and
a reference cell;
wherein a first input terminal of the sense amplifier is coupled to a first terminal of the first switch and the data cell, a second input terminal of the sense amplifier is coupled to a first terminal of the second switch and the reference cell, and a second terminal of the first switch is coupled to a second terminal of the second switch through the current trimming circuit, and
wherein the current trimming circuit is configured to trim a current of the first input terminal of the sense amplifier when the first switch is turned on, and trim a current of the second input terminal of the sense amplifier when the second switch is turned on.

2. The circuit according to claim 1, wherein the current trimming circuit comprises M first trimming branches, and each first trimming branch comprises a third switch and a first transistor connected in series to the third switch, and
wherein a first terminal of the first transistor is coupled to the second terminal of the first switch and the second terminal of the second switch, a second terminal of the first transistor is coupled to a first terminal of the third switch, a second terminal of the third switch is coupled to a power supply, and third terminals of first transistors in the M first trimming branches are coupled to each other.

3. The circuit according to claim 2, wherein each first trimming branch further comprises a second transistor, a first terminal of the second transistor is coupled to the second terminal of the first transistor, a second terminal of the second transistor is coupled to the first terminal of the third switch, and third terminals of second transistors in the M first trimming branches are coupled to each other.

4. The circuit according to claim 1, wherein the current trimming circuit comprises N second trimming branches, and each second trimming branch comprises a fourth switch and a third transistor connected in series to the fourth switch, and
wherein a first terminal of the third transistor is coupled to the second terminal of the first switch and the second terminal of the second switch, a second terminal of the third transistor is coupled to a first terminal of the fourth switch, a second terminal of the fourth switch is grounded, and third terminals of third transistors in the N second trimming branches are coupled to each other.

5. The circuit according to claim 4, wherein each second trimming branch further comprises a fourth transistor, a first terminal of the fourth transistor is coupled to the second terminal of the third transistor, a second terminal of the fourth transistor is coupled to the first terminal of the fourth switch, and third terminals of fourth transistors in the N second trimming branches are coupled to each other.

6. The circuit according to claim 2, wherein the data reading circuit further comprises registers and a one-time programmable memory coupled to the registers, the registers are coupled to the first switch, the second switch, and the current trimming circuit, and the registers are configured to:
obtain control information from the one-time programmable memory; and
control the first switch and the current trimming circuit based on the control information, or control the second switch and the current trimming circuit based on the control information, wherein the control information comprises control manners of the first switch and the current trimming circuit, or comprises control manners of the second switch and the current trimming circuit.

7. The circuit according to claim 1, wherein the data reading circuit further comprises a fifth transistor and a sixth transistor, a first terminal of the fifth transistor is coupled to the first terminal of the first switch, a second terminal of the fifth transistor is coupled to the data cell, and a third terminal of the fifth transistor is coupled to a preset voltage, a first terminal of the sixth transistor is coupled to the first terminal of the second switch, a second terminal of the sixth transistor is coupled to the reference cell, and a third terminal of the sixth transistor is coupled to the preset voltage.

8. A terminal device comprising:
a resistive random access memory comprising:
resistive memory cells;
a data reading circuit connected to the resistive memory cells for reading data stored in the resistive memory cells, wherein the data reading circuit comprises:
a sense amplifier;
a first switch;
a second switch; a current trimming circuit; and
a reference cell;
wherein a first input terminal of the sense amplifier is coupled to a first terminal of the first switch and the data cell, a second input terminal of the sense amplifier is coupled to a first terminal of the second switch and the reference cell, and a second terminal of the first switch is coupled to a second terminal of the second switch through the current trimming circuit; and
wherein the current trimming circuit is configured to trim a current of the first input terminal of the sense amplifier when the first switch is turned on, and trim a current of the second input terminal of the sense amplifier when the second switch is turned on.

9. The circuit according to claim 8, wherein the current trimming circuit comprises M first trimming branches, and each first trimming branch comprises a third switch and a first transistor connected in series to the third switch,
wherein a first terminal of the first transistor is coupled to the second terminal of the first switch and the second terminal of the second switch, a second terminal of the first transistor is coupled to a first terminal of the third switch, a second terminal of the third switch is coupled to a power supply, and third terminals of first transistors in the M first trimming branches are coupled to each other.

10. The circuit according to claim 9, wherein each first trimming branch further comprises a second transistor, a first terminal of the second transistor is coupled to the second terminal of the first transistor, a second terminal of the second transistor is coupled to the first terminal of the third switch, and third terminals of second transistors in the M first trimming branches are coupled to each other.

11. The circuit according to claim 8, wherein the current trimming circuit comprises N second trimming branches, and each second trimming branch comprises a fourth switch and a third transistor connected in series to the fourth switch, and
wherein a first terminal of the third transistor is coupled to the second terminal of the first switch and the second terminal of the second switch, a second terminal of the third transistor is coupled to a first terminal of the fourth switch, a second terminal of the fourth switch is grounded, and third terminals of third transistors in the N second trimming branches are coupled to each other.

12. The circuit according to claim 11, wherein each second trimming branch further comprises a fourth transistor, a first terminal of the fourth transistor is coupled to the second terminal of the third transistor, a second terminal of the fourth transistor is coupled to the first terminal of the fourth switch, and third terminals of fourth transistors in the N second trimming branches are coupled to each other.

13. The circuit according to claim 9, wherein the data reading circuit further comprises registers and a one-time programmable memory coupled to the registers, the registers are coupled to the first switch, the second switch, and the current trimming circuit, and the registers are configured to:
obtain control information from the one-time programmable memory; and
control the first switch and the current trimming circuit based on the control information, or control the second switch and the current trimming circuit based on the control information, wherein the control information comprises control manners of the first switch and the current trimming circuit, or comprises control manners of the second switch and the current trimming circuit.

14. The circuit according to claim 8, wherein the data reading circuit further comprises a fifth transistor and a sixth transistor, a first terminal of the fifth transistor is coupled to the first terminal of the first switch, a second terminal of the fifth transistor is coupled to the data cell, and a third terminal of the fifth transistor is coupled to a preset voltage, a first terminal of the sixth transistor is coupled to the first terminal of the second switch, a second terminal of the sixth transistor is coupled to the reference cell, and a third terminal of the sixth transistor is coupled to the preset voltage.

* * * * *